United States Patent
Nakamura

(10) Patent No.: US 7,880,485 B2
(45) Date of Patent: Feb. 1, 2011

(54) HIGH-SENSITIVE RESISTANCE MEASURING DEVICE AND MONITORING METHOD OF SOLDER BUMP

(75) Inventor: Naoaki Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 443 days.

(21) Appl. No.: 12/116,399

(22) Filed: May 7, 2008

(65) Prior Publication Data

US 2009/0058435 A1 Mar. 5, 2009

(30) Foreign Application Priority Data

Aug. 27, 2007 (JP) .............................. 2007-219993

(51) Int. Cl.
*G01R 27/08* (2006.01)

(52) U.S. Cl. ...................... 324/705; 324/713

(58) Field of Classification Search .................. 324/705, 324/691, 649, 600, 421, 525, 526, 555, 718, 324/713, 522

See application file for complete search history.

(56) References Cited

U.S. PATENT DOCUMENTS

| | | | | |
|---|---|---|---|---|
| 3,913,403 A | * | 10/1975 | Arcara | ........................ 374/173 |
| 5,804,979 A | * | 9/1998 | Lund et al. | ................... 324/713 |
| 7,388,387 B2 | * | 6/2008 | Bordelon, Jr. | ............... 324/713 |

FOREIGN PATENT DOCUMENTS

| | | |
|---|---|---|
| JP | 7-104023 | 4/1995 |
| JP | 2003-43091 | 2/2003 |

\* cited by examiner

*Primary Examiner*—Hoai-An D Nguyen
(74) *Attorney, Agent, or Firm*—Staas & Halsey LLP

(57) ABSTRACT

According to an aspect of an embodiment, a high-sensitive resistance measuring device of solder bumps comprises a resistance variation detection unit which detects a differential voltage ($\Delta V = V1 - V2$), which is obtained by subtracting a second voltage (V2) generated in a reference bump connection unit by a constant current (I) from a second constant current source from a first voltage (V1) generated in a monitored bump connection unit by the constant current I from a first constant current source, as a resistance variation voltage representing a resistance variation ($\Delta R$) of the monitored bump connection unit.

23 Claims, 16 Drawing Sheets

HIGH-SENSITIVE RESISTANCE MEASURING DEVICE AND MONITORING METHOD OF SOLDER BUMP

This application is a priority based on prior applications No. JP 2007-219993, filed Aug. 23, 2007, in Japan.

BACKGROUND

1. Field

The present art relates to a high-sensitive resistance measuring device and method of solder bumps which monitor the solder connection state of a package such as a ball grid array mounted on a circuit board by the solder bumps and, particularly, relates to the high-sensitive resistance measuring device and monitoring method of the solder bumps which detect and monitor minute variations of resistance caused by cracks generated in the solder bumps by stress.

2. Description of the Related Arts

Recently, in a ball grid array package (hereinafter, referred to as a "BGA package") that mounts plural processors on a system board of, for example, a server, power source pins and signal pins are increased to 1000 pins or 2000 pins due to enhancement of functions and increase of power consumption of the server, and the size of the BGA package is increased along with that. When the size of the BGA package is increased in this manner, due to mutual difference in thermal expansion coefficients caused by thermal cycles of the system board, the BGA package, and semiconductor ICs constituting processors having different materials, stress is repeatedly applied to the solder connection units between solder bumps of the BOA package and the circuit board, and there is a danger that stress distortions of the solder bump connection units are increased, thereby causing damages such as minute cracks. The size of the circuit board such as a system board on which BGA packages are mounted has also been increased; and, when the size of the circuit board is increased, there is a danger that board deformation caused during handling or board assembly processes of the circuit board may cause damages such as minute cracks in solder bumps of the BGA package. When the minute cracks are generated in the solder bumps of the BGA package, the cracks gradually grow along with time elapse; and, when the development state of the cracks exceeds a certain limitation, the cracks rapidly grow, thereby rapidly increasing the resistance of the solder bumps and sometimes leading to rupture, and these damages such as the minute cracks are a cause of long-term reliability deterioration. The damages of the solder bumps in the BGA package cause increase of the resistance of the solder bump connection units; however, in order to detect initial damages of minute crack generation, extremely minute resistance variations have to be detected. Conventionally, as a method of detecting minute resistance variations, for example, a four-terminal method is known. In the four-terminal method, a circuit which supplies the current for resistance measurement and a circuit which detects the voltage generated in resistance are independent; therefore, two terminals for current supply and two terminals for voltage measurement, i.e., four terminals in total are provided. The voltmeter used in the four-terminal method has extremely high internal resistance, and almost no current flows through the circuit at the voltage measurement side; therefore, the voltage drop caused by, for example, contact resistance of a solder bump connection unit serving as a measurement object or wiring resistance of the measurement device can be ignored, and merely the resistance of the solder bump connection unit can be accurately measured.

[Patent document 1] Japanese Patent Application Laid-Open Publication No. 2003-043091
[Patent document 2] Japanese Patent Application Laid-Open Publication No. H7-104023

However, detection of resistance variations of the solder bump connection unit using such a conventional four-terminal method has a problem that the detection sensitivity is insufficient, and minute resistance variations cannot be accurately detected. As the conventional four-terminal method, for example, when a voltmeter having minimum resolution power of 1 mill volt and a measurement range of 100 mill volts is presupposed, furthermore, initial resistance of the solder bump connection unit is presupposed to be 1 ohm, and the current value of the constant current that flows through the solder bump connection unit is presupposed to be 1 mill ampere, the initial electric potential is 1 mill volt, and the electric potential variation of 1 mill volt shows the resistance variation of 1 ohm. In order to detect the resistance variation corresponding to the development state of the cracks of the solder bump connection unit, the resolution power of about 0.01 percent of the initial resistance is needed. Thus, if the initial resistance is 1 ohm, a resistance variation of 0.01 ohm has to be detected. The resolution power of resistance detection can be enhanced in this manner by increasing the current value of the constant current that flows through the solder bump connection unit by the four-terminal method. Then, when the current value of the constant current is increased to 100 mill amperes, the voltage variation of 1 mill volt can represent the resistance variation of 0.01 ohm. However, since the initial resistance of the solder bump is 1 ohm, the initial value of the measured voltage is 100 mill volts, which is the max of the range; and, when the resistance thereafter is increased by 0.01 ohm, the measured voltage overflows to 101 mill volts, and minute resistance variations cannot be measured, which is a problem. Furthermore, when a particular solder bump connection unit is subjected to quality determination by detecting minute resistance variations, since the resistance is varied also by the temperature variations of the entire package, the resistance variation caused by damages such as cracks of the solder bump connection unit and the resistance variation caused by the temperature variation cannot be distinguished from each other, and the resistance variation caused by the damages of the solder bump connection unit cannot be detected, which is a problem.

SUMMARY

According to an aspect of an embodiment, a high-sensitive resistance measuring device of solder bumps comprises a package having a rear surface on which plural solder bumps are arranged, a circuit board on which the solder bumps of the package are mounted by soldering, a monitored bump connection unit which is selected as a solder connection unit which is readily damaged by deforming stress, a reference bump connection unit which is selected as a solder connection unit which is not readily damaged by deforming stress, a first constant current source which is connected to the monitored bump connection unit in series and causes a constant current to flow, and a second constant current source which commonly connects the series circuit of the first constant current source and the monitored bump connection unit by common sides, and a resistance variation detection unit which detects a differential voltage ($\Delta V = V1 - V2$), which is obtained by subtracting a second voltage (V2) generated in the reference bump connection unit by the constant current (I) from the second constant current source from a first voltage (V1) generated in the monitored bump connection unit by the constant current I from the first constant current source, as a resistance variation voltage representing the resistance variation (□R) of the monitored bump connection unit.

DETAILED DESCRIPTION OF THE PREFERRED EMBODIMENTS

Figure 1:
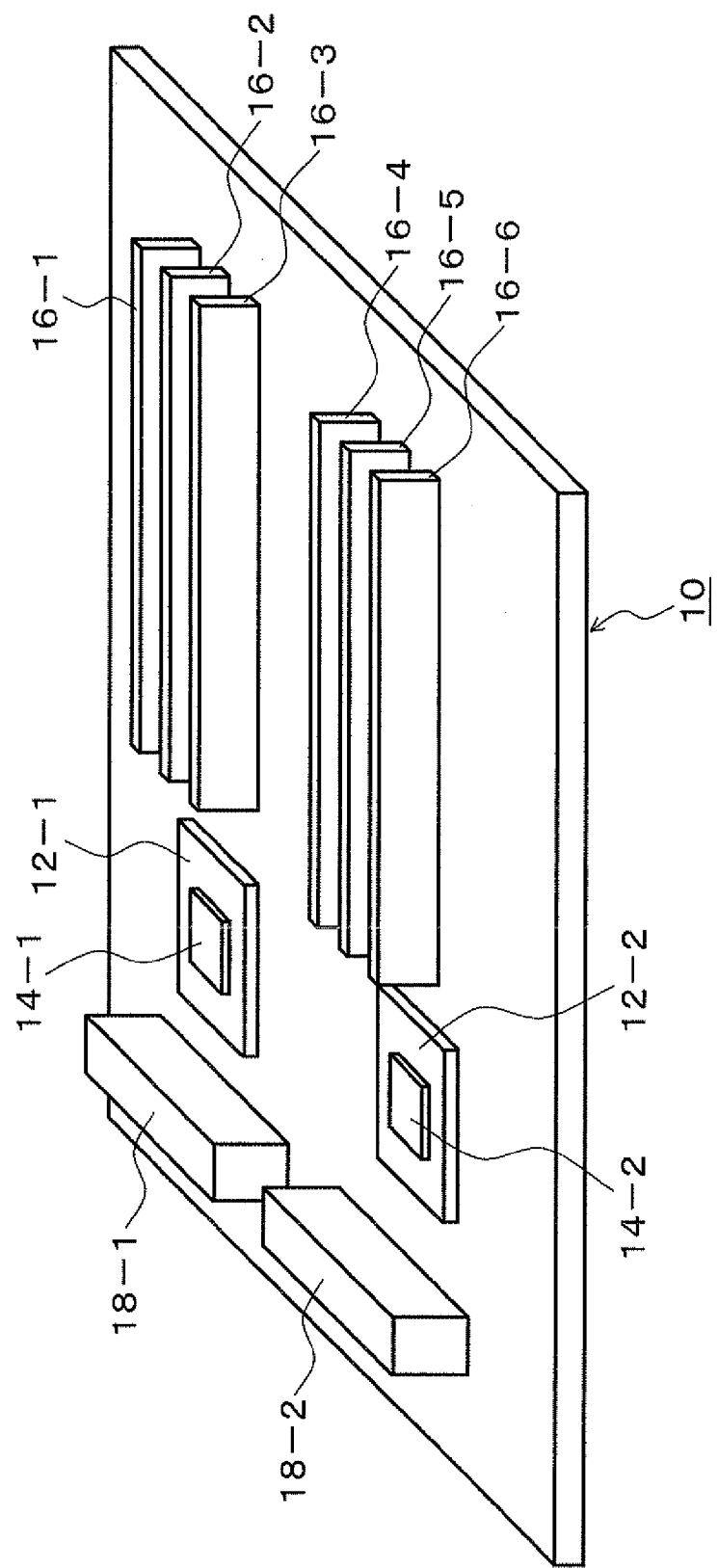
FIG. 1 is an explanatory drawing showing a mother board on which BGA packages serving as resistance measurement objects according to the present art are mounted.

FIG. 1 is an explanatory drawing showing a mother board on which BGA packages serving as resistance measurement objects according to the present art are mounted. In FIG. 1, the mother board 10 is, for example, a circuit board incorporated in a chassis or the like of a server, the BGA packages 12-1 and 12-2 are mounted on the mother board, and, for example, processor modules 14-1 and 14-2 are mounted as LSIs on the BGA packages 12-1 and 12-2 in this embodiment. In addition, on the mother board 10, semiconductor parts such as memory modules 16-1 to 16-6 and power source modules 18-1 and 18-2 are mounted. Regarding the mother board 10 used by incorporating in a server chassis, recently, the board size is a large size, for example, exceeding several tens of centimeters by several tens of centimeters; and, there are high possibilities that flexure or deformation is generated in the entire board in handling or assembly processes of the mother board 10 since the size is large, thereby applying mechanical stress to the parts connected by solder bumps of the BGA packages 12-1 and 12-2 mounted on the mother board and damaging them.

Figure 2:
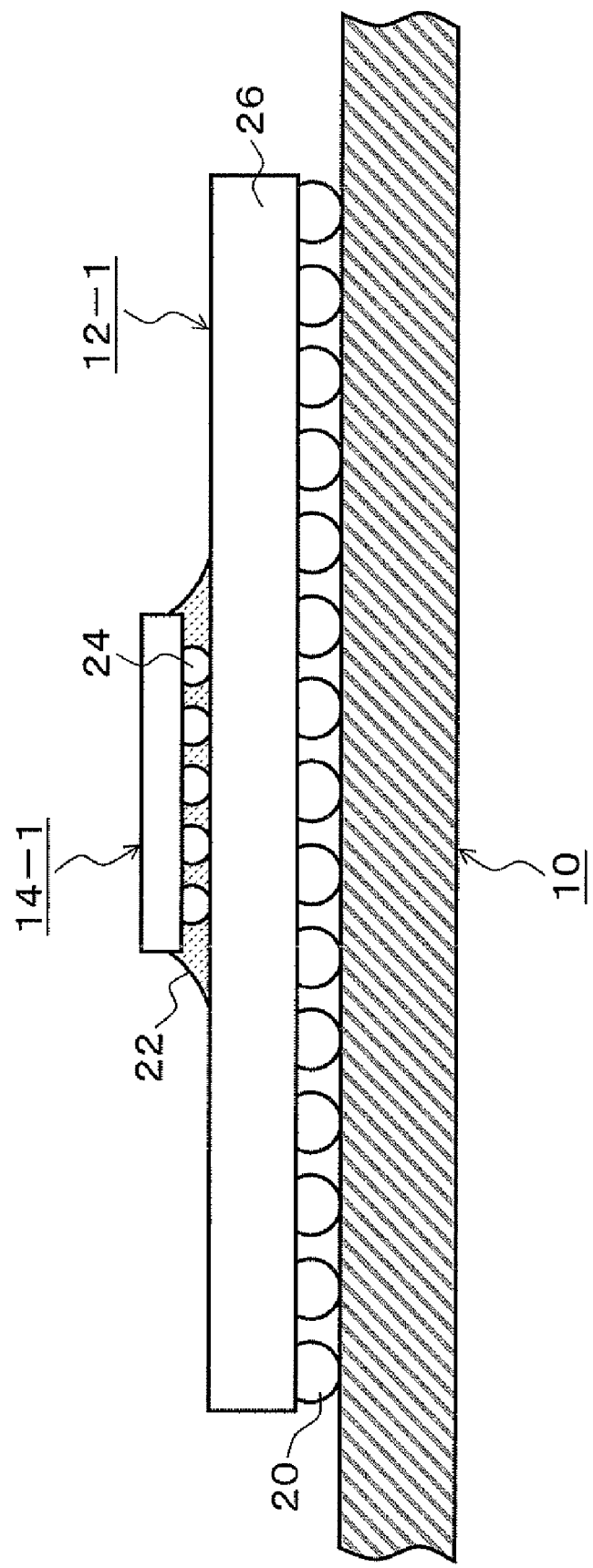
FIG. 2 is an explanatory drawing focusing on and showing the mounted part of the BGA package in FIG. 1.

FIG. 2 is an explanatory drawing focusing on and showing a mounted part of the BGA package in FIG. 1. In FIG. 2, in the BGA package 12-1 mounted on the motherboard 10, plural solder bumps 20 are disposed on a rear surface of a multi-layer printed board 26, and the processor module 14-1 is similarly mounted on an upper surface of the multi-layer printed board 26 by soldering by solder bumps 24 on the rear surface thereof. Moreover, regarding the mounting of the processor module 14-1 to the BGA package 12-1 by the solder bumps 24, an insulation seal layer 22 is interposed therebetween, thereby causing the solder-connected solder bumps 24 to have a sealed structure and fixing them by the insulation seal layer 22 so that mechanical stress is not applied to the connection units of the solder bumps 24. On the other hand, regarding the mounting of the BGA package 12-1 to the mother board 10 by the solder bumps 20, the surrounding area of the solder bumps 20 are hollow; therefore, with respect to the solder bumps 20 bonding the BGA package 12-1 to the mother board 10 by soldering, mechanical stress caused by, for example, deformation of the mother board 10 or the difference of thermal expansion coefficients depending on the materials of the mother board 10 and the BGA package 12-1 is applied. Particularly, when the mother board 10 is incorporated in a chassis or the like of a server, mechanical stress is repeatedly applied to the solder bumps 20 due to the thermal cycles in the server; as a result, minute cracks are generated in the solder bumps 20 to which mechanical stress is most readily applied, and the resistance of the part connected by the solder bumps 20 may be increased due to expansion of the cracks along with time elapse.

Figure 3:
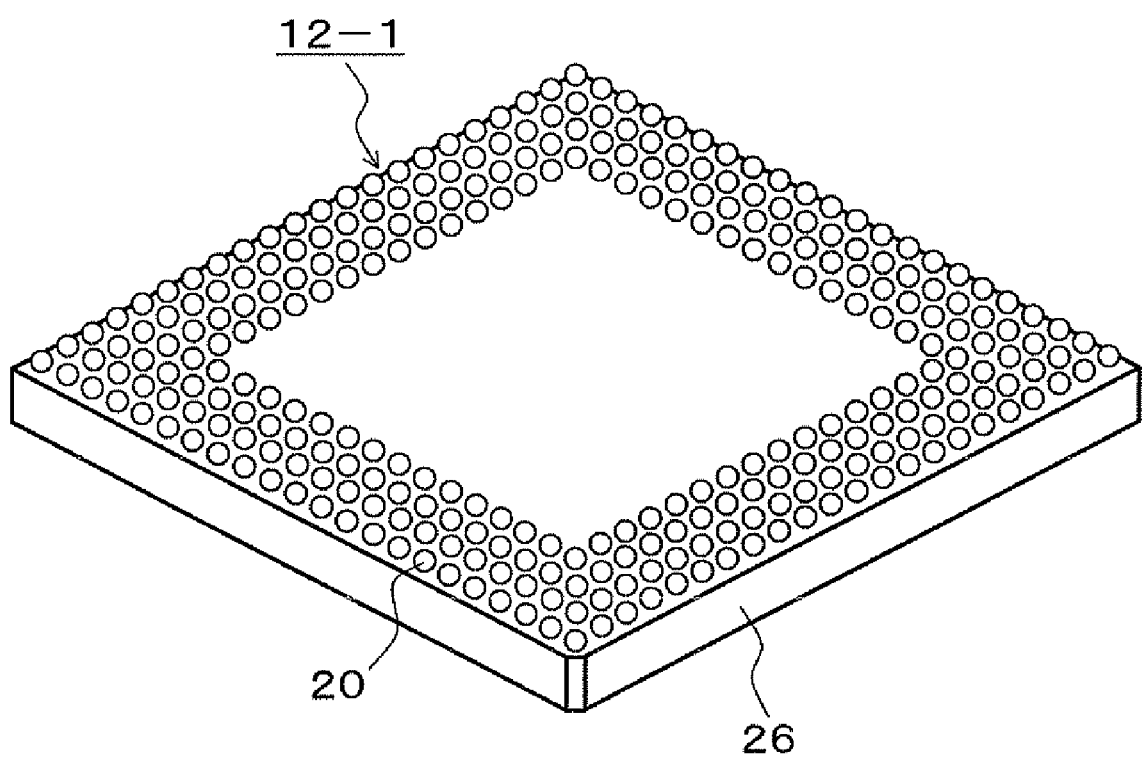
FIG. 3 is an explanatory drawing showing the rear surface of the BGA package.

FIG. 3 is an explanatory drawing showing the rear surface of the BGA package in FIG. 2. In FIG. 3, a large number of solder bumps 20 are arranged on the rear surface of the multi-layer printed board 26 in the BGA package 12-1. Each of the solder bumps 20 is electrically connected to a connection pad of the solder bump 24 of the processor module 14-1 of the upper side shown in FIG. 2 through conductive patterns and via holes in the height direction of the layers of the multi-layer printed board 26. In the BGA package 12-1, the board materials of the multi-layer printed board 26 include two types, i.e., that using ceramic and that using a synthetic resin, and the thermal expansion coefficients thereof are different from each other.

Figure 4:
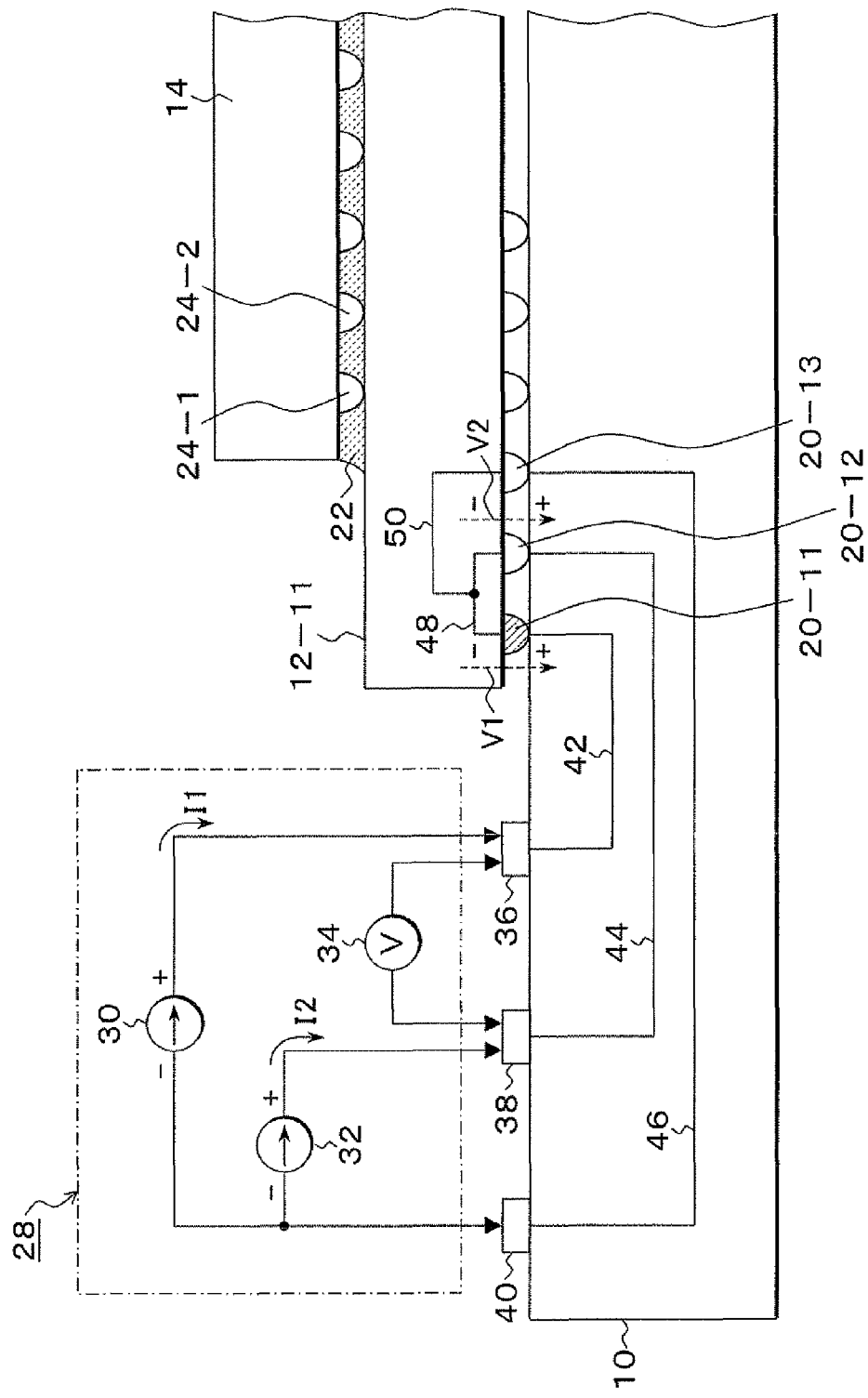
FIG. 4 is an explanatory drawing showing an embodiment of a resistance measuring device of solder bumps in a ceramic-made BGA package.

FIG. 4 is an explanatory diagram showing an embodiment of a resistance measuring device of solder bumps in a ceramic-made BGA package. In FIG. 4, the ceramic-made BGA package 12-11 is mounted on the mother board 10 serving as a circuit board by soldering by the solder bumps, and a processor module 14 is mounted on the ceramic-made BGA package 12-11 by soldering by solder bumps 24-1, 24-2, . . . sealed by the insulation seal layer 22. Outside such mother board 10, the solder bump measuring device 28 of the present embodiment is provided and connected to the mother board 10, for example, by connectors, or the like. In the solder bumps provided on the ceramic-made BGA package 12-11, it is known that the solder bumps positioned at the outermost periphery in the mounted state by soldering with respect to the mother board 10 are readily damaged due to mechanical deforming stress between them and the mother board 10, and the more the solder bumps are positioned at the inner side, the less readily they are damaged by the deformation stress of the mother board 10.

Figure 5:
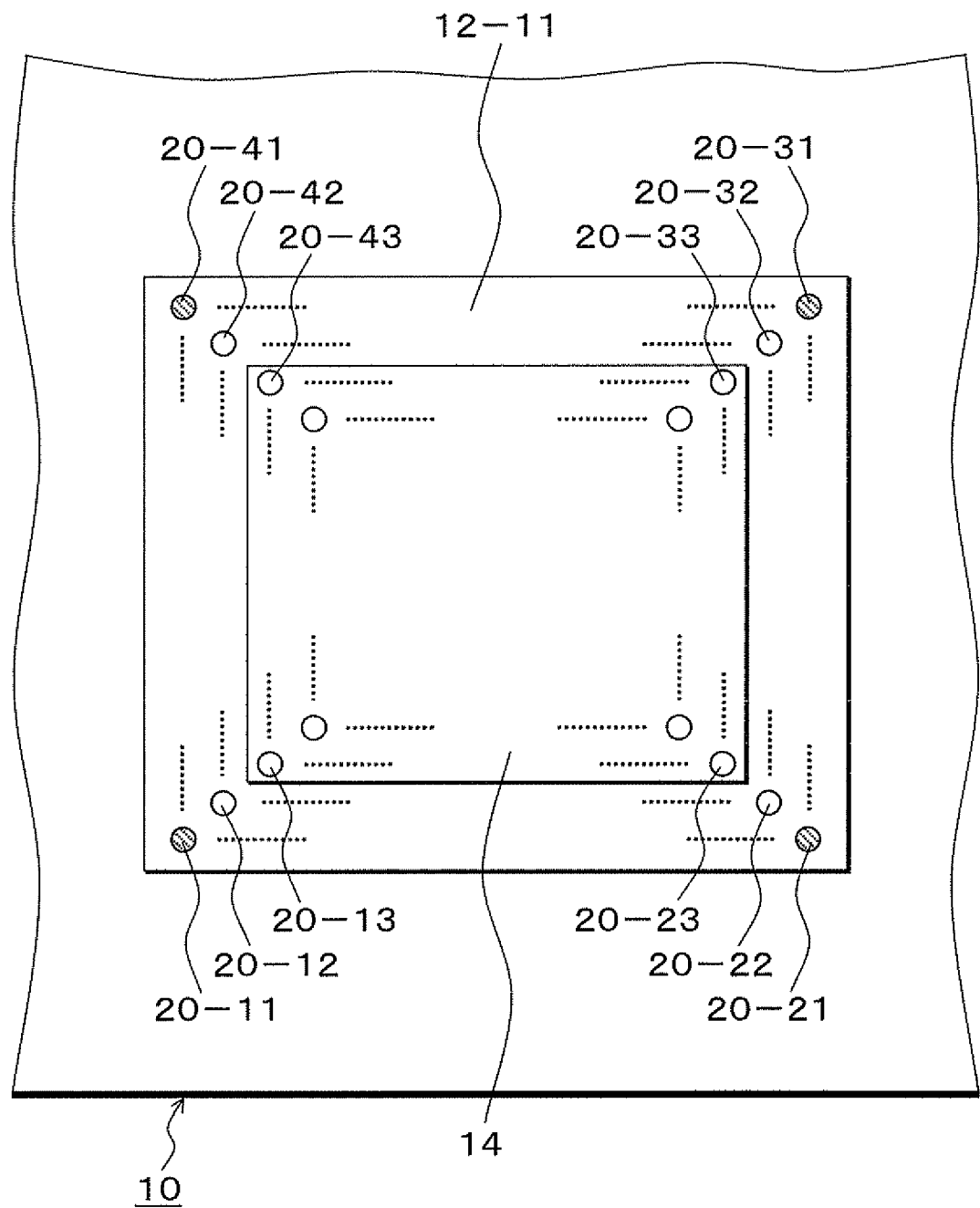
FIG. 5 is an explanatory drawing showing the positions of monitored bumps and reference bumps in the ceramic-made BGA package in FIG. 4.

FIG. 5 shows the solder bumps in the ceramic-made BGA package 12-11 in FIG. 4 in a transparent manner in the mounted state in which the mother board 10 and the processor module 14 are superimposed with each other. In the ceramic-made package 12-11 in FIG. 5, the solder bumps positioned in the outermost periphery are most readily damaged by deformation stress, and, particularly, the four solder bumps 20-11, 20-21, 20-31, and 20-41 positioned at outermost peripheral corners are the solder bumps most readily damaged by deforming stress. Therefore, in the present embodiment, in the case of the ceramic-made BGA package 12-11, the four solder bumps 20-11, 20-21, 20-31, and 20-41 positioned at the outermost peripheral corners are selected as the solder bumps which are most readily damaged by deforming stress, and these are considered to be monitored bumps. In the description hereinafter, the solder bumps 20-11, 20-21, 20-31, and 20-41 are referred to as monitored bumps. On the other hand, the solder bumps adjacently positioned inside of the outermost periphery are the solder bumps which are not readily damaged by the deforming stress compared with the outermost periphery, and, in FIG. 5, the solder bumps at the corners positioned inside the monitored bumps 20-11, 20-21, 20-31, and 20-41 are considered to be reference bumps 20-12, 20-22, 20-32, and 20-42. Referring again to FIG. 4, the solder bump resistance measuring device 28 provided outside measures resistance variations of the monitored bump by using the monitored bump which is a solder bump at the outermost peripheral corner part shown in FIG. 5 in the ceramic-made BGA package 12-11 and the reference bump adjacent to it.

In FIG. 4, the monitored bump 20-11 and the reference bump 20-12 positioned at the left lower corner in FIG. 5 and a relay bump 20-13 positioned inside of them are taken as examples to perform resistance measurement of the solder bumps. In the solder bump resistance measuring device 28, a first constant current source 30, a second constant current source 32, and a DC voltmeter 34 which functions as a resistance variation detection unit are provided. On the surface of the mother board 10, measurement terminals 36, 38, and 40 are formed, and signal lines from the solder bump resistance measuring device 28 are connected thereto, for example, by connectors so as to use them. The measurement terminal 36 is connected to the monitored bump 20-11 by a measurement wiring pattern 42, the measurement terminal 38 is connected to the reference bump 20-12 by a measurement wiring pattern 44, and the measurement terminal 40 is connected to the relay bump 20-13 by a measurement wiring pattern 46. In addition, the monitored bump 20-11 and the reference bump 20-12 are connected by a measurement wiring pattern 48 by using the multi-layer printed board of the ceramic-made BGA package 12-11, and the measurement wiring pattern 48 is connected to the relay bump 20-13 by a measurement wiring pattern 50. The first constant current source 30 provided in the solder bump resistance measuring device 28 connects the negative side thereof to the measurement terminal 40 and connects the positive side thereof to the measurement terminal 36, thereby causing a constant current I1 to flow through the path that goes through the monitored bump 20-11 and generating a voltage V1 corresponding to the resistance shown by an arrow of a broken line in the connection part of the monitored bump 20-11. The second constant current source 32 connects the negative side thereof to the measurement terminal 40 as well as the first constant current source 30, connects the positive side thereof to the measurement terminal 38, and causes a constant current I2 to flow through the reference bump 20-12. When the constant current I2 is caused to flow, a voltage V2 corresponding to resistance is generated in the direction shown by an arrow of a broken line in the reference bump 20-12. The DC voltmeter 34 measures the voltage between the measurement terminal 36 and the measurement terminal 38. Specifically, the voltage V1 caused by the constant current I1 generated in the monitored bump 20-11 is applied to the positive terminal of the DC voltmeter 34, and the voltage V2 caused by the constant current I2 generated in the reference bump 20-12 is applied to the negative terminal side, so that, as a result, the DC voltmeter 34 displays the voltage of the differential voltage (V1−V2) obtained by subtracting the generated voltage V2 of the reference bump 20-12 from the generated voltage V1 of the monitored bump 20-11.

Figure 6:
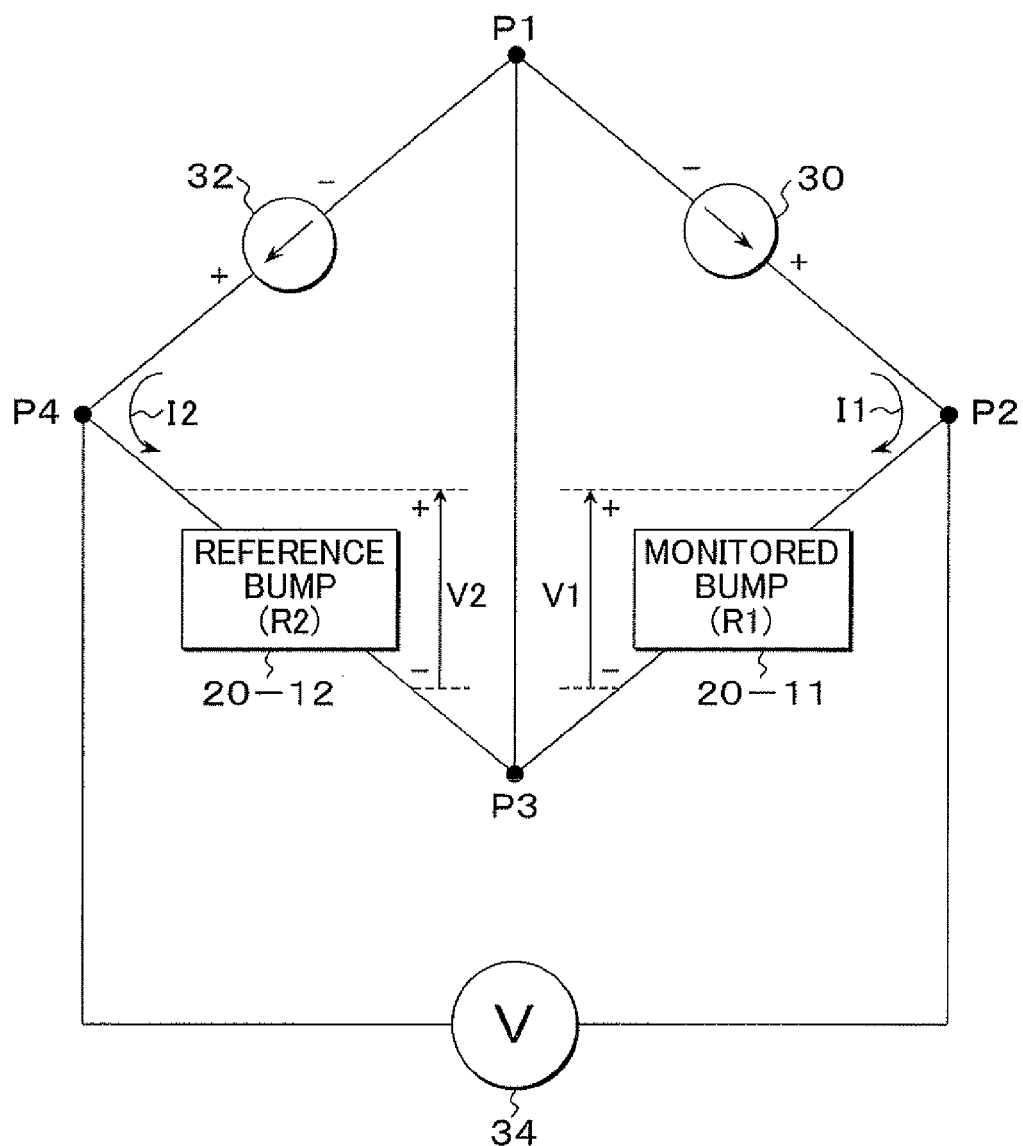
FIG. 6 is a circuit diagram showing an equivalent circuit of the embodiment in FIG. 4.

FIG. 6 is a circuit diagram showing an equivalent circuit of the embodiment in FIG. 4. In FIG. 6, the solder bump resistance measuring device 28 in FIG. 5 forms a bridge circuit as the equivalent circuit including the monitored bump 20-11 and the reference bump 20-12 of the ceramic-made BGA package 12-11. The bridge circuit connects the negative sides of the first constant current source 30 and the second constant current source 32 to each other at a connecting point P1 and connects the positive side of the first constant current source 30 to the monitored bump 20-11 at a connecting point P2. Moreover, at a connecting point P3, the monitored bump 20-11 and the reference bump 20-12 are connected to each other. Furthermore, at a connecting point P4, the positive side of the second constant current source 32 and the reference bump 20-12 are connected to each other. Furthermore, the connecting point P1 at which the common sides of the first constant current source 30 and the second constant current source 32 in the bridge circuit are commonly connected is directly connected to the connecting point P3 at which the monitored bump 20-11 and the reference bump 20-12 are connected so that the common sides are made common to each other. The DC voltmeter 34 is connected to the connecting points P1 and P4. Therefore, the differential voltage (V1−V2) obtained by subtracting the voltage V2 generated by the constant current I2 flowing through the reference bump 20-12 from the voltage V1 generated by the constant current I1 flowing through the monitored bump 20-11 is applied to the positive side of the DC voltmeter 34. The measurement sensitivity of the resistance in the equivalent circuit in FIG. 6 is specifically described as the following. Herein, as the DC voltmeter 34, that having minimum resolution power of 1 mill volt and a measurement range of 100 mill volts is used. Moreover, resistance R1 of the monitored bump 20-11 in an undamaged initial state is presupposed to be 1 ohm, and, similarly, resistance R2 of the reference bump 20-12 is presupposed to be the same, that is, 1 ohm. In this state, the constant currents I1 and I2 that flow from the first constant current source 30 and the second constant current source 32 are caused to be, for example, I1=I2=100 mill amperes. At this point, the voltages V1 and V2 generated in the monitored bump 20-11 and the reference bump 20-12 having the initial resistance of 1 ohm are V1=V2=100 milliamperes×1 ohm=100 millivolts. At this point, the differential voltage (V1−V2) of the voltages V1 and V2 is applied to and measured by the DC voltmeter 34; therefore, V1−V2=100 mill volts−100 mill volts=0 mill volt. It is supposed that, in this state, the monitored bump 20-11 is damaged to generate minute cracks, the resistance R1 is increased by 0.01 ohm from the initial resistance of 1 ohm, and it is changed to R1=1.01 ohm. Therefore, the voltage V1 generated in the monitored bump 20-11 is increased to V=1.01 ohm×100 mill amperes=101 mill volts, and the differential voltage: (V1−V2)=101 millivolts−100 mill volts=1 Mill volt is applied to and displayed by the DC voltmeter 34. Therefore, in the present embodiment, even when the same constant current, I1=I2=100 mill amperes is caused to flow from the first constant current source 30 and the second constant current source 32, the DC voltmeter 34 does not overflow; and, for example, when the initial resistance of the resistance value of the monitored bump 20-11 is increased by 0.01 ohm, 1 mill volt corresponding to the resistance variation detection voltage corresponding to this resistance variation can be displayed. Herein, in the embodiment in FIG. 6, the example in which 100 mill amperes are caused to flow as the constant currents I1 and I2 from the first constant current source 30 and the second constant current source 32 is taken; however, the resolution power of resistance detection can be enhanced by further increasing the constant currents I1 and I2. For example, when the constant currents, I1=I2=1000 mill amperes are set, the display of the DC voltmeter 34 when the resistance of the monitored bump 20-11 is increased by 0.001 ohm is 1 mill volt, and the minimum resolution power can be caused to be 0.001 ohm. Furthermore, in the equivalent circuit in FIG. 6, the resistance values of the monitored bump 20-11 and the reference bump 20-12 have temperature coefficients which are varied in accordance with variation of the environmental temperature; regarding the resistance variation caused by the environmental temperature, the same resistance variation appears in the monitored bump 20-11 and the reference bump 20-12, and the same variation is caused also in the voltages V1 and V2 by the constant currents I1 and I2; and, since the DC voltmeter 34 displays the differential voltage (V1−V2), the resistance variation caused by the environmental temperature is cancelled out, and the DC voltmeter 34 can detect and display merely the resistance variation of the monitored bump 20-11 caused by damages.

Figure 7:
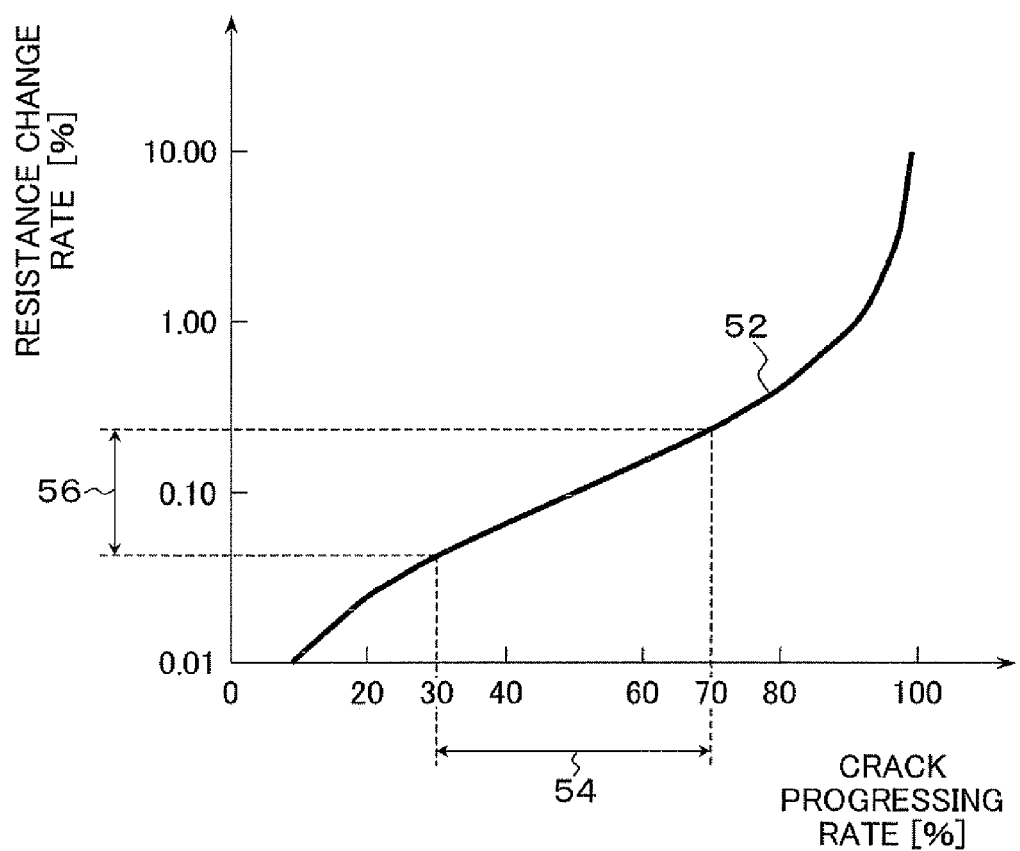
FIG. 7 is a graph diagram showing the relation between the crack progressing rate and resistance change rate of a solder bump measured in the present embodiment.

FIG. 7 is a graph showing the relation between the crack progressing rate and the resistance change rate of the solder bump in the BGA package measured in the present embodiment. In FIG. 7, the horizontal axis shows the crack progressing rate of the solder bump, and the vertical axis shows the resistance change rate of the solder bump. In FIG. 7, with respect to the crack progressing rate of the solder bump, the resistance change rate is changed as shown by a curved line 52. More specifically, the resistance rate begins to change when the crack progressing rate is in the vicinity of 10%, and, although the resistance change rate is approximately linearly increased when the crack progressing rate is in the range of 20 to 80%, the resistance change rate is rapidly increased when the crack progressing rate exceeds 80%. In order to accurately detect the resistance change rate associated with the crack progressing rate of the solder bump, when the detection resolution power capable of detecting 0.01 ohm, i.e., the resistance change rate of 0.01% as shown with respect to the equivalent circuit in FIG. 6, the resistance change associated with the crack progress can be accurately captured. In actual measurement, a threshold value range 54 for alert is set in the range of 30% to 70% of the crack progressing rate, a threshold value is set at a particular value in an alarm range 56 of the resistance change rate corresponding to that, for example, at 0.10% of the resistance change rate, and, when the detection voltage corresponding to the resistance change detected by the DC voltmeter 34 in FIG. 6 exceeds, for example, 10 mill volts corresponding to the resistance change rate of 0.1%, the monitored bump can be determined to be abnormal so as to take necessary measure. In the resistance measurement of the solder bumps by the solder bump resistance measuring device 28 shown in FIG. 4 according to the present art, for example in an examination step of a manufacturing line of mounting the processor module 14 to the mother board 10 by using the ceramic-made BGA package 12-11, the solder bump resistance measuring device 28 is connected by connectors to the measurement terminals 36, 38, and 40 of the mother board 10, the resistance of the monitored bump 20-11 of the outermost peripheral corner part of the assembled ceramic-made BGA package 12-11, and quality can be determined according to the state that whether damages due to minute cracks are generated or not. Moreover, in environmental tests of the manufactured mother board 10, the solder bump resistance measuring device 28 is connected as shown in FIG. 4, the resistance value change of the monitored bump 20-11 is measured during the environmental tests, and whether the resistance is increased or not by the damages caused along with the environmental tests is measured. The environmental tests used by the solder bump resistance measuring device 28 of the present embodiment include various environmental tests such as vibration tests and thermal shock tests.

Figure 8:
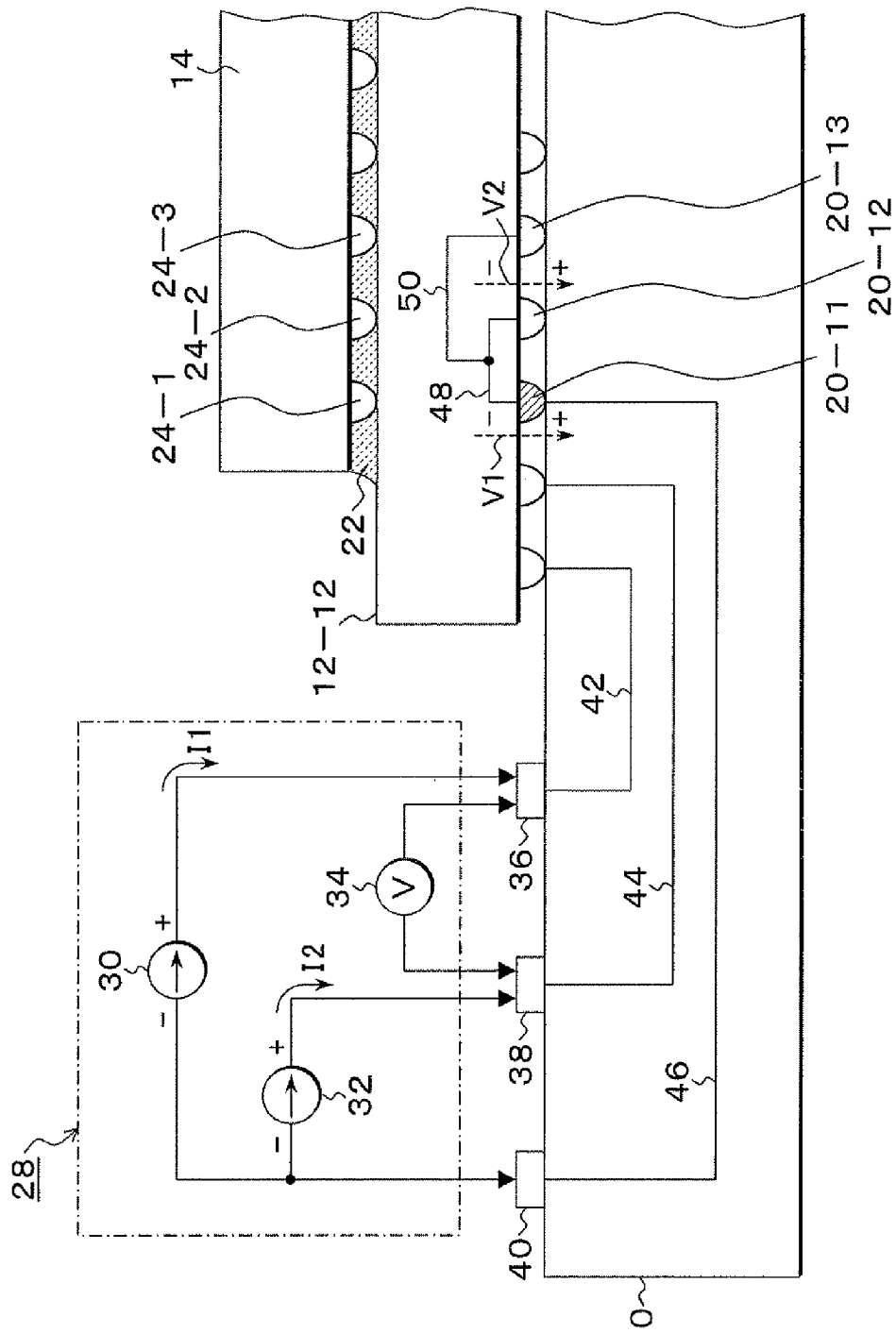
FIG. 8 is an explanatory drawing showing an embodiment of a resistance measuring device of solder bumps in a synthetic-resin-made BGA package.

FIG. 8 is an explanatory diagram showing an embodiment of a solder bump resistance measuring device in a synthetic-resin-made BGA package. The BGA package mounted on the mother board 10 in FIG. 8 by solder bumps uses a synthetic-resin-made BGA package 12-12 which is manufactured by using a synthetic resin as a main material. On the synthetic-resin-made BGA package 12-12, as well as the ceramic-made BGA package 12-11 in FIG. 4, the processor module 14 is mounted by the solder bumps 24-1, 24-2, 24-3, via the insulation seal layer 22.

Figure 9:
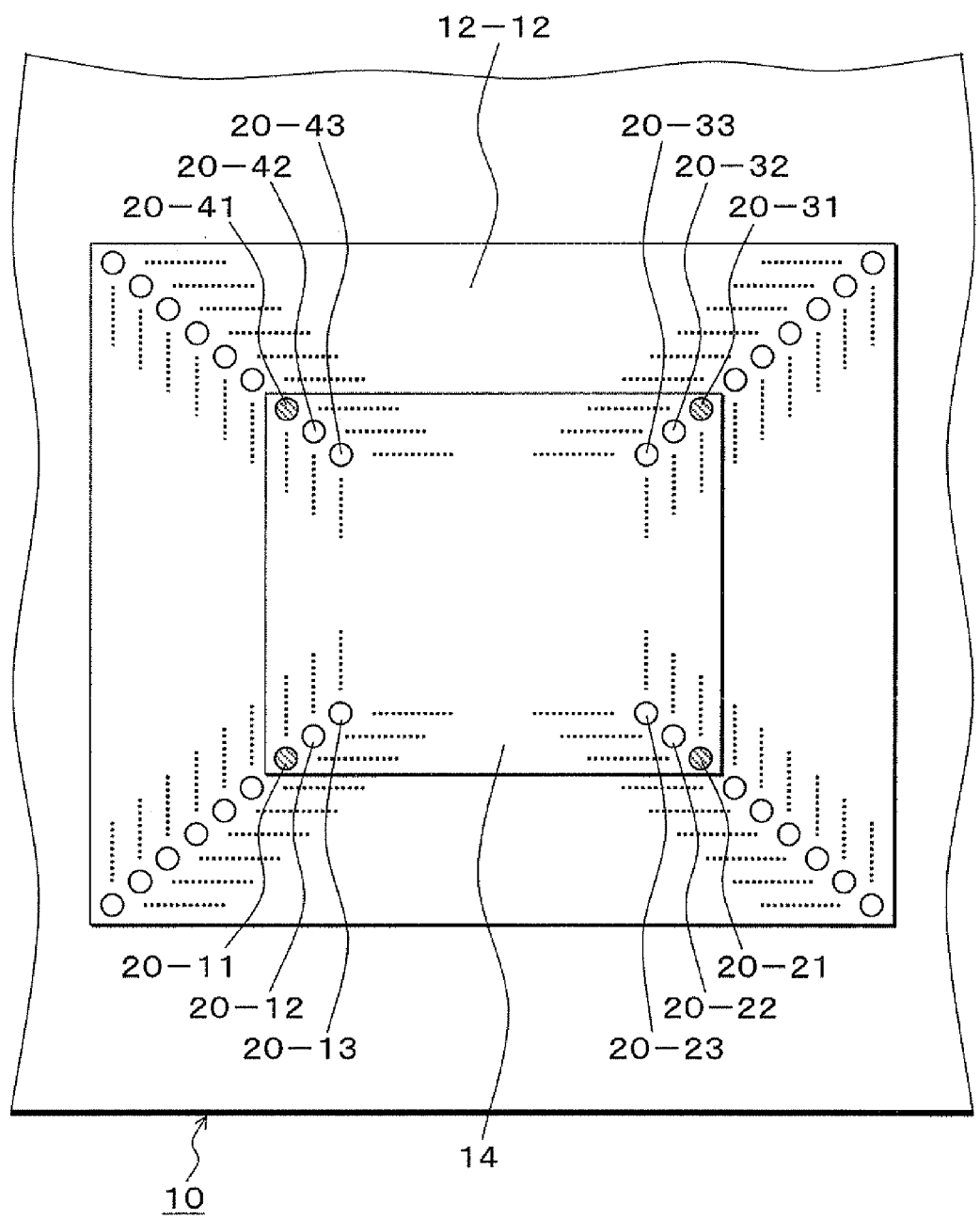
FIG. 9 is an explanatory drawing showing the positions of monitored bumps and reference bumps in the synthetic-resin-made BGA package in FIG. 8.

FIG. 9 is an explanatory drawing showing the positions of monitored bumps and reference bumps in the synthetic-resin-made BGA package 12-12 in FIG. 8. In FIG. 9, in the case of the synthetic-resin-made BGA package 12-12, the solder bumps which are readily damaged by the deforming stress from the mother board 10 are the bumps immediately below the solder bumps at the outermost peripheral corner parts where the processor module 14 is provided, and these are considered to be the monitored bumps 20-11, 20-21, 20-31, and 20-41 as shown by oblique lines. The solder bumps inside the monitored bumps 20-11, 20-21, 20-31, and 20-41 are considered to be the reference bumps 20-12, 20-22, 20-32, and 20-42 which are not readily damaged by the deforming stress from the mother board. Furthermore, the bumps inside of them are considered to be relay bumps 20-13, 20-23, 20-33, and 20-43. In this manner, in the synthetic-resin-made BGA package 12-12, the solder bumps immediately below the outermost peripheral corner parts of the processor module 14 mounted at the top are the solder bumps which are most readily damaged by deforming stress for the reason that it is determined by the thermal expansion coefficients depending on the respective materials thereof. Herein, the thermal expansion coefficient of the synthetic-resin-made BGA package 12-12 is about 11 ppm; on the other hand, the processor module 14 mounted at the top has a thermal expansion coefficient of 3 ppm, which is small, since the main material thereof is silicon. Moreover, the synthetic-resin-made BGA package 12-12 is soft in terms of material compared with the silicon-made processor module 14. Therefore, the expansion/contraction change at the processor module 14 side is small with respect to the change of thermal cycles, and the expansion/contraction change of the synthetic-resin-made BGA package 12-12 of a soft material is large; thus, the largest stress is applied to, for example, the monitored bump 20-11 which is the solder bump immediately below the solder bump 24-1 at the outermost periphery of the processor module 14. Therefore, in the present embodiment, the solder bump in the synthetic-resin-made BGA package 12-12 immediately below the solder bump 24-1 at an outermost peripheral corner part of the processor module 14 is selected as the monitored bump 20-11.

In FIG. 8, except for the point that the positions of the monitored bump 20-11 and the reference bump 20-12 in the synthetic-resin-made BGA package 12-12 are different from the case of the ceramic-made BGA package 12-11 in FIG. 4, the measurement wiring patterns of the mother board 10 and the synthetic-resin-made BGA package 12-12 from the solder bump resistance measuring device 28, which is provided outside by connector connection, and measurement terminals to the monitored bump 20-11, the reference bump 20-12, and the relay bump 20-13 are same as those of the embodiment in FIG. 4. Moreover, the equivalent circuit thereof is also the same as that shown in FIG. 6; and, similarly, when the constant currents are I1–I2=100 mill amperes, the resistance variations caused by the damages of the monitored bump 20-11 can be detected at detection sensitivity of 0.01 ohm.

Figure 10:
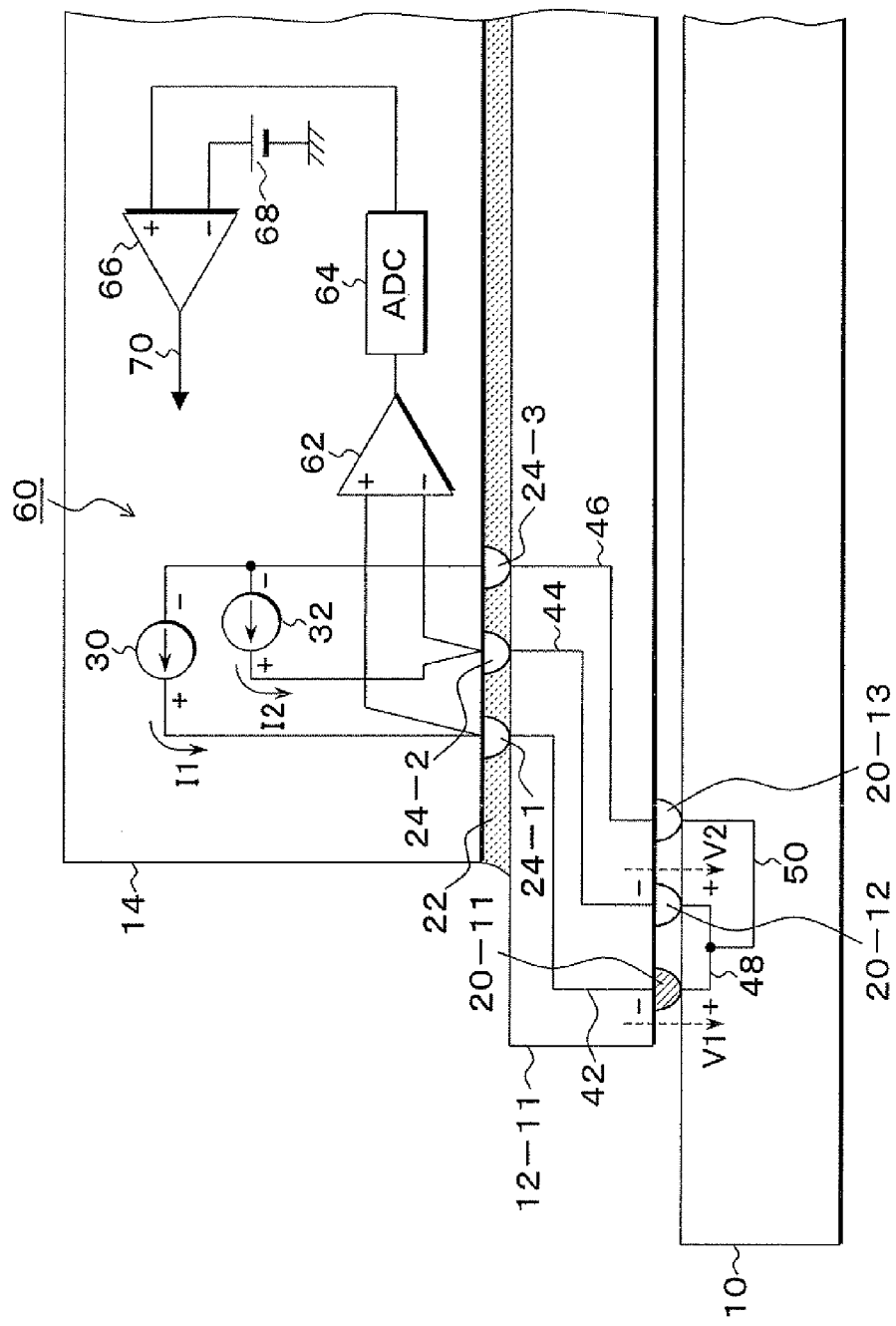
FIG. 10 is an explanatory drawing showing another embodiment in which a solder bump resistance measuring unit is incorporated in a processor module mounted on a ceramic-made BGA package.

FIG. 10 is an explanatory diagram showing another embodiment in which a solder bump resistance measuring unit is incorporated in a processor module mounted on a ceramic-made BGA package. In FIG. 10, the monitored bump 20-11, the reference bump 20-12, and the relay bump 20-13 in the ceramic-made BGA package 12-11 mounted on the mother board 10 are at the same positions as the embodiment in FIG. 4, and the solder bump resistance measuring unit 60 for measuring the resistance variation of the monitored bump 20-11 is incorporated in the processor module 14. The solder bump resistance measuring unit 60 incorporated in the processor module 14 has the first constant current source 30 and the second constant current source 32, connects the solder bumps 24-1, 24-2, and 24-3 to the monitored bump 20-11, the reference bump 20-12, and the relay bump 20-13 by the measurement wiring patterns 42, 44, and 46, connects the monitored bump 20-11 and the reference bump 20-12 to each other at the mother board 10 side by the measurement wiring pattern 48, and then further connects the measurement wiring pattern 48 to the relay bump 20-13 by the measurement wiring pattern 50. The first constant current source 30 causes the constant current I1 to flow through the monitored bump 20-11 so as to generate the voltage V1 corresponding to the resistance shown by an arrow of a broken line. The second constant current source 32 causes the constant current r2 to flow through the reference bump 20-12 so as to generate the voltage V2 in the direction shown by an arrow of a broken line.

Herein, the constant currents I1 and I2 of the first constant current source 30 and the second constant current source 32 have the same current value; therefore, since the undamaged initial resistance of the monitored bump 20-11 and the reference bump 20-12 are the same, the voltages V1 and V2 are also the same. The voltage V1 caused by the resistance of the monitored bump 20-11 and the voltage V2 dependant on the resistance of the reference bump 20-12 are input to a differential voltage detecting unit 62 provided in the solder bump resistance measuring unit 60 of the processor module 14, and the differential voltage (V1–V2) is output. When the initial resistance of the case in which the monitored bump 20-11 and the reference bump 20-12 are not damaged is the same, V1=V2; therefore, the differential voltage (V1–V2) output from the differential voltage detecting unit 62 is zero. The output of the differential voltage detecting unit 62 is converted into digital data by an AD converter 64 and input to a digital comparator 66. A predetermined threshold voltage 68 is set for the digital comparator 66; and, when the differential voltage data exceeds the threshold voltage 68, the digital comparator 66 outputs a malfunction detection signal 70.

Figure 11:
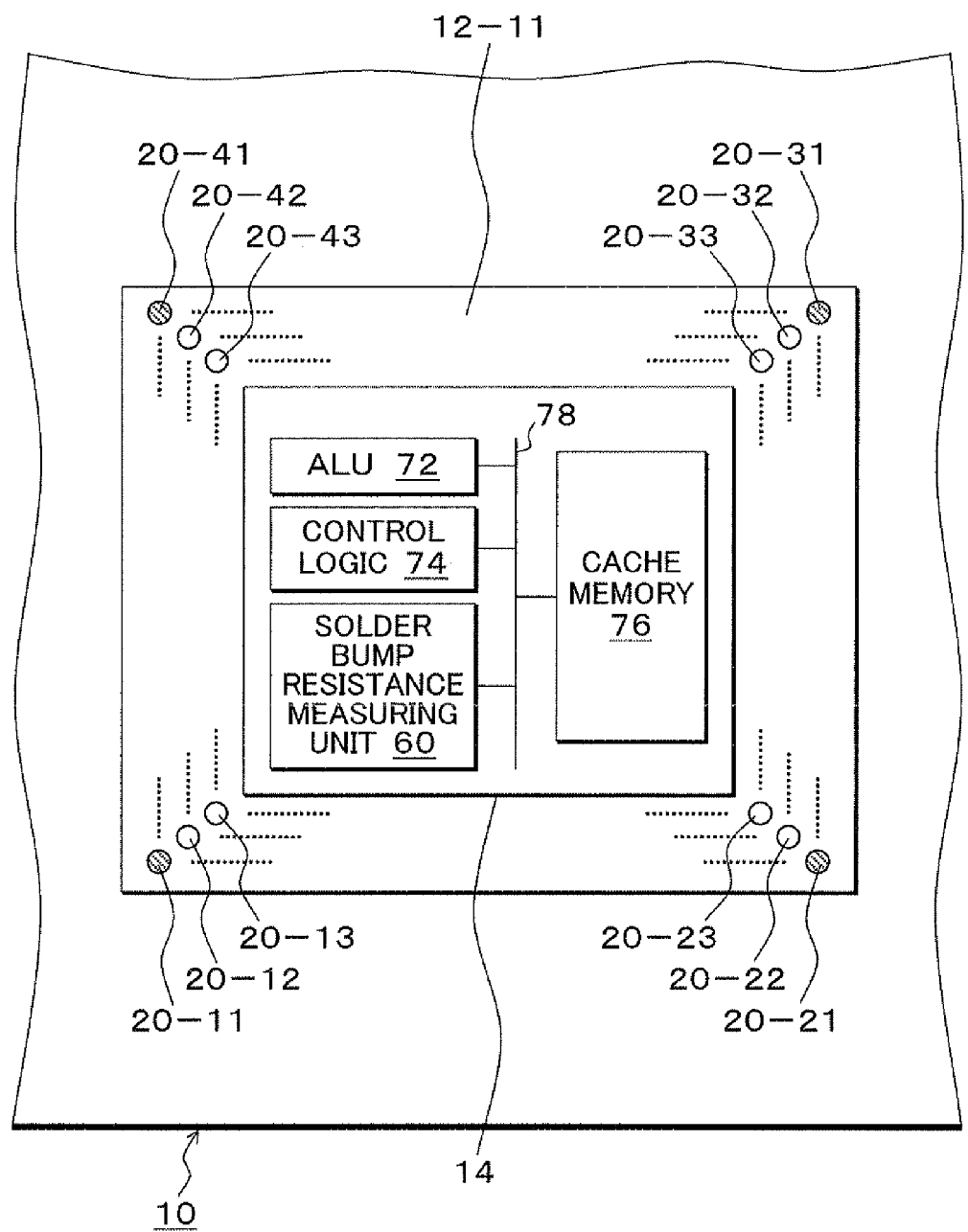
FIG. 11 is an explanatory drawing showing the positions of monitored bumps and reference bumps and the internal configuration of the processor module in the ceramic-made BGA package in FIG. 8.

FIG. 11 is an explanatory diagram showing the positions of the monitored bumps and reference bumps in the ceramic-made BGA package in FIG. 8 and the internal structure of the processor module. In FIG. 11, the positions of the monitored bumps and the reference bumps in the ceramic-made BGA package 12-11 are the same as FIG. 5, the solder bumps at the outermost peripheral corner parts in the ceramic-made BGA package 12-11 are considered to be the monitored bumps 20-11, 20-21, 20-31, and 20-41 which are most readily damaged by the deforming stress from the mother board 10 and the processor module 14, and the solder bumps at the corner parts inside of them are considered to be reference bumps 20-12, 20-22, 20-32, and 20-42. In the processor module 14 mounted on the ceramic-made BGA package 12-11, an accumulator (ALU) 72, a control logic 74, and a cache memory 76 are mutually connected by a bus 78 so that commands and data are loaded from an outside main storage to the cache memory 76, computing processes are executed by the ALU 72, and predetermined programs are executed. In addition to such configuration of the processor module 14, in the present embodiment, the solder bump resistance measuring unit 60 is further incorporated in the processor module 14. The solder bump resistance measuring unit 60 has the circuit and functional configuration shown in FIG. 10. When the solder bump resistance measuring unit 60 in FIG. 10 detects a resistance change of the monitored bump 20-11 exceeding the threshold voltage 68 from the digital comparator 66, for example, a resistance change exceeding the threshold voltage corresponding to the resistance change rate of 0.10% shown in FIG. 7, outputs the malfunction detection signal 70. When the malfunction detection signal 70 is output from the solder bump resistance measuring unit 60, in the processor module 14 in FIG. 11, the malfunction detection signal is recognized by the control logic 74; and, if this state continues, the cracks of the monitored bump expand, and malfunction operation of the processor is caused by increase of the resistance value; therefore, the processor module 14 itself stops processes in terms of software and operates so as to degenerate to the processes of another processor mounted on the mother board 10. As a result, before cracks are generated in the solder bump and failure due to resistance increase is caused, the processor module can receive the malfunction signal from the solder bump resistance measuring unit 60, stop the processes of itself by self operations in terms of software, and perform degeneration processes of passing the processes to the normal processor module in a recovery manner.

Figure 12:
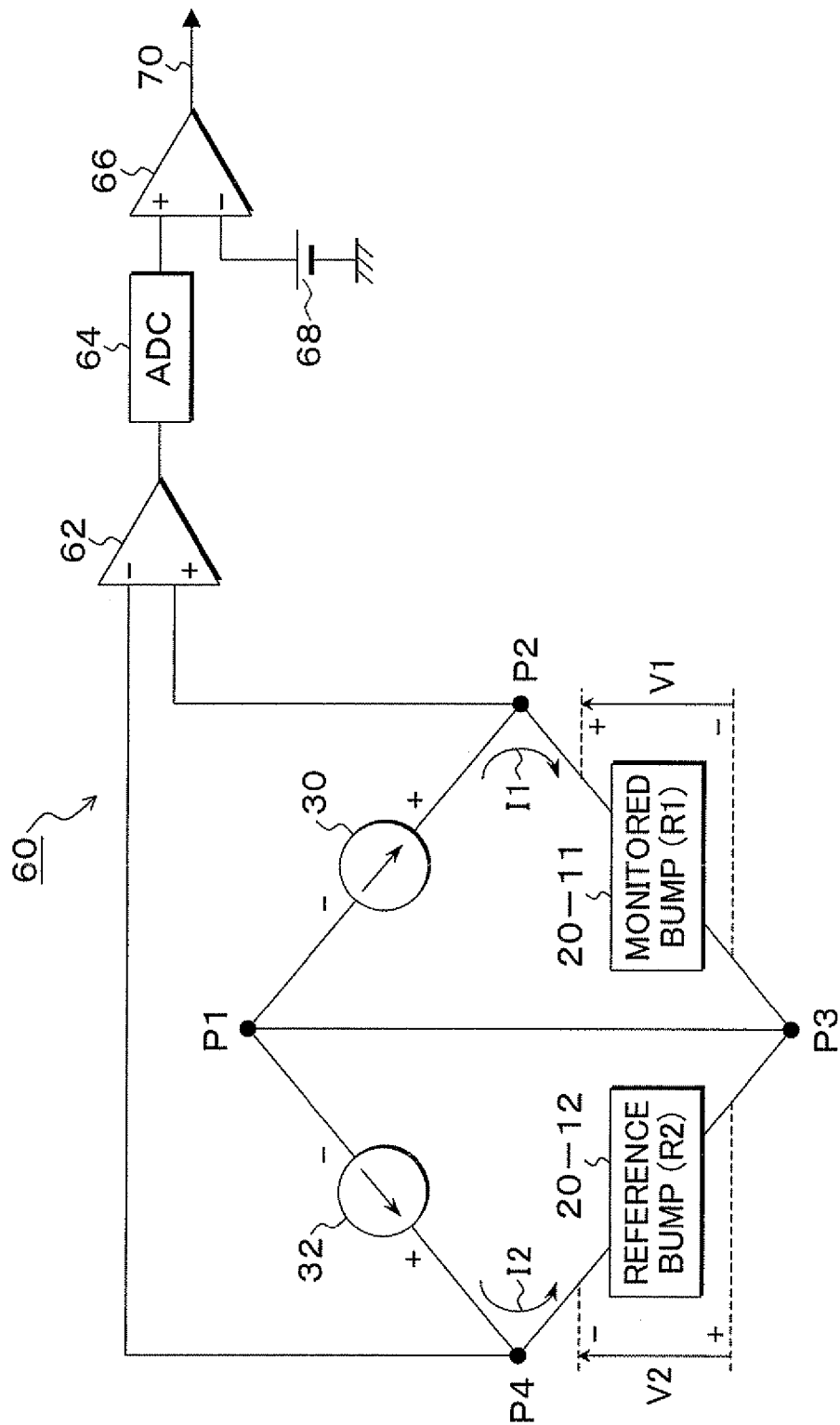
FIG. 12 is a circuit diagram showing an equivalent circuit of the embodiment in FIG. 10.

FIG. 12 is a circuit diagram showing the equivalent circuit of the embodiment in FIG. 10. In FIG. 12, as well as FIG. 6, this equivalent circuit forms a bridge circuit by the first constant current source 30, the second constant current source 32, the monitored bump 20-11, and the reference bump 20-12 and connects the connecting points P1 and P3 in the bridge circuit to each other, thereby causing the common sides of the first constant current source 30 and the second constant current source 32 to be common. Moreover, in the equivalent circuit in FIG. 12, since the DC voltmeter 34 as shown in FIG. 6 is not used, the connecting points P2 and P4 are input and connected to the differential voltage detection unit 62; the differential voltage (V1–V2) of the voltage V1 which is generated by causing the constant current I1 to flow through the monitored bump 20-11 and dependent on resistance and the voltage V2 which is generated depending on resistance when the constant current I2 is caused to flow through the monitored bump 20-11 is obtained, converted into differential voltage data by the AD converter 64, and compared with the threshold voltage 68 by the digital comparator 66; and, when it exceeds the threshold voltage 68, the malfunction detection signal 70 is output.

Figure 13:
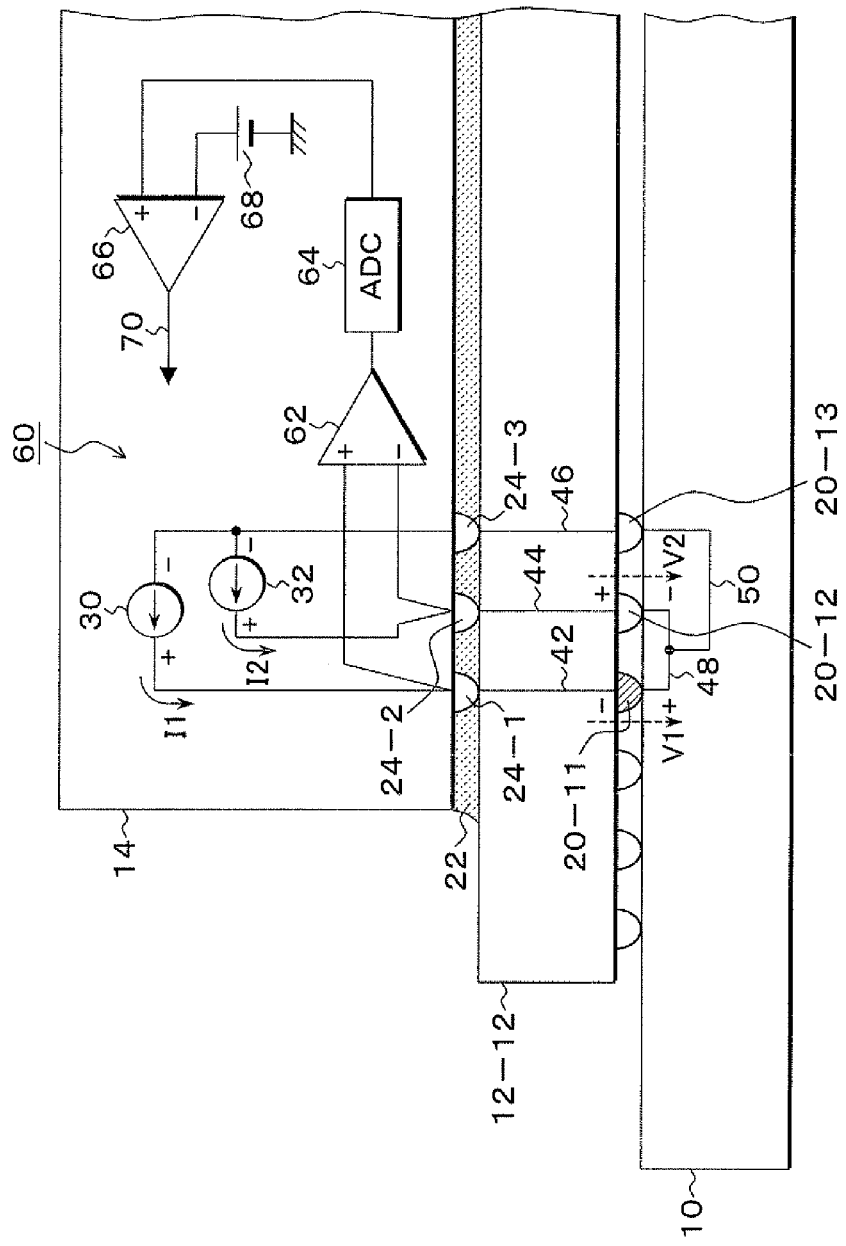
FIG. 13 is an explanatory drawing showing another embodiment in which a solder bump resistance measuring unit is incorporated in a processor module mounted on a synthetic-resin-made BGA package.

FIG. 13 is an explanatory diagram showing another embodiment in which the solder bump resistance measuring unit is incorporated in the processor module mounted on a synthetic-resin-made BGA package. In FIG. 13, in the synthetic-resin-made BGA package 12-12, as well as the embodiment in FIG. 8, the solder bump positioned immediately below the solder bump at an outermost peripheral corner part in the processor module 14, for example, the solder bump 24-1 is selected as the monitored bump 20-11 which is most readily damaged by deforming stress, the solder bump inside thereof is selected as the reference bump 20-12, and the solder bump further inside thereof is selected as the relay bump 20-13. With respect to the monitored bump 20-11, the reference bump 20-12, and the relay bump 20-13 of such synthetic-resin-made BGA package 12-12, measurement wiring patterns 42, 44, and 46 are connected from the solder bumps 24-1, 24-2, and 24-3 of the processor module 14 in which the solder bump resistance measuring unit 60 is incorporated. Meanwhile, at the mother board 10 side, the monitored bump 20-11 and the reference bump 20-12 are connected to each other by the measurement wiring pattern 48 and are further connected to the relay bump 20-13 by the measurement wiring pattern 50. The solder bump resistance measuring unit 60 incorporated in the processor module 14 is same as the embodiment in FIG. 10.

Figure 14:
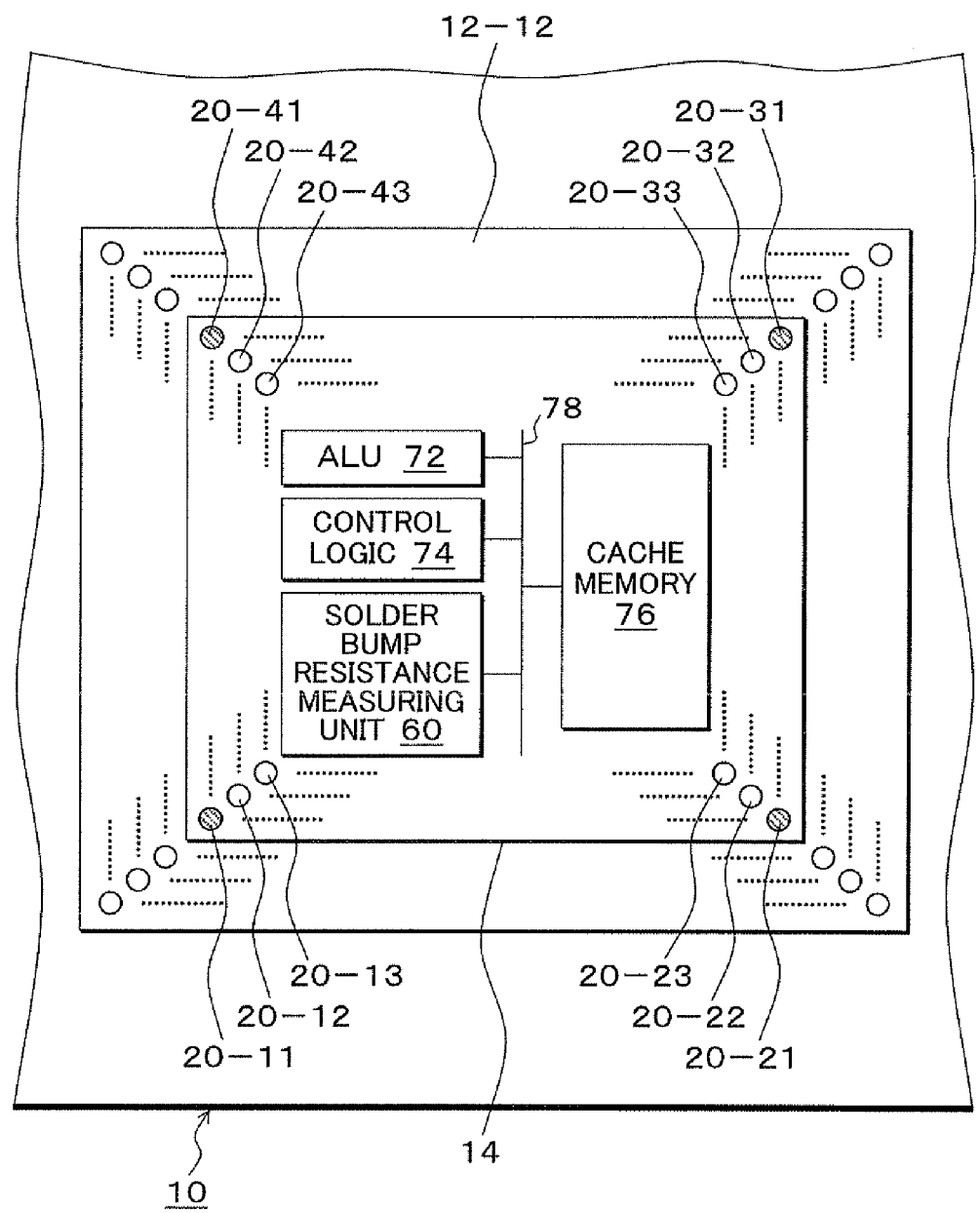
FIG. 14 is an explanatory drawing showing the positions of monitored bumps and reference bumps and the internal configuration of the processor module in the synthetic-resin-made BGA package in FIG. 13.

FIG. 14 is an explanatory diagram showing the positions of the monitored bumps and the reference bumps in the synthetic-resin-made BGA package 12-12 in FIG. 13 and the internal structure of the processor module. The positions of the monitored bumps and the reference bumps are the same as the embodiment in FIG. 10, the solder bumps immediately below the outermost peripheral corner parts in the processor module 14 are considered to be the monitored bumps 20-11, 20-21, 20-31, and 20-41, and the solder bumps inside of them are considered to be the reference bumps 20-12, 20-22, 20-32, and 20-42. In the processor module 14, as well as the case in FIG. 11, the accumulator 72, the control logic 74, and the cache memory 76 are provided and connected by the bus 78; and, furthermore, the solder bump resistance measuring unit 60 is provided. The function of the solder bump resistance measuring unit 60 incorporated in the processor module 14 is as shown in FIG. 13, and the equivalent circuit thereof is same as FIG. 12. The self stop in the processor module when the malfunction detection signal 70 is obtained from the digital comparator 66 of the solder bump resistance measuring unit 60 is also the same as the embodiment in FIG. 10 and FIG. 11.

Figure 15:
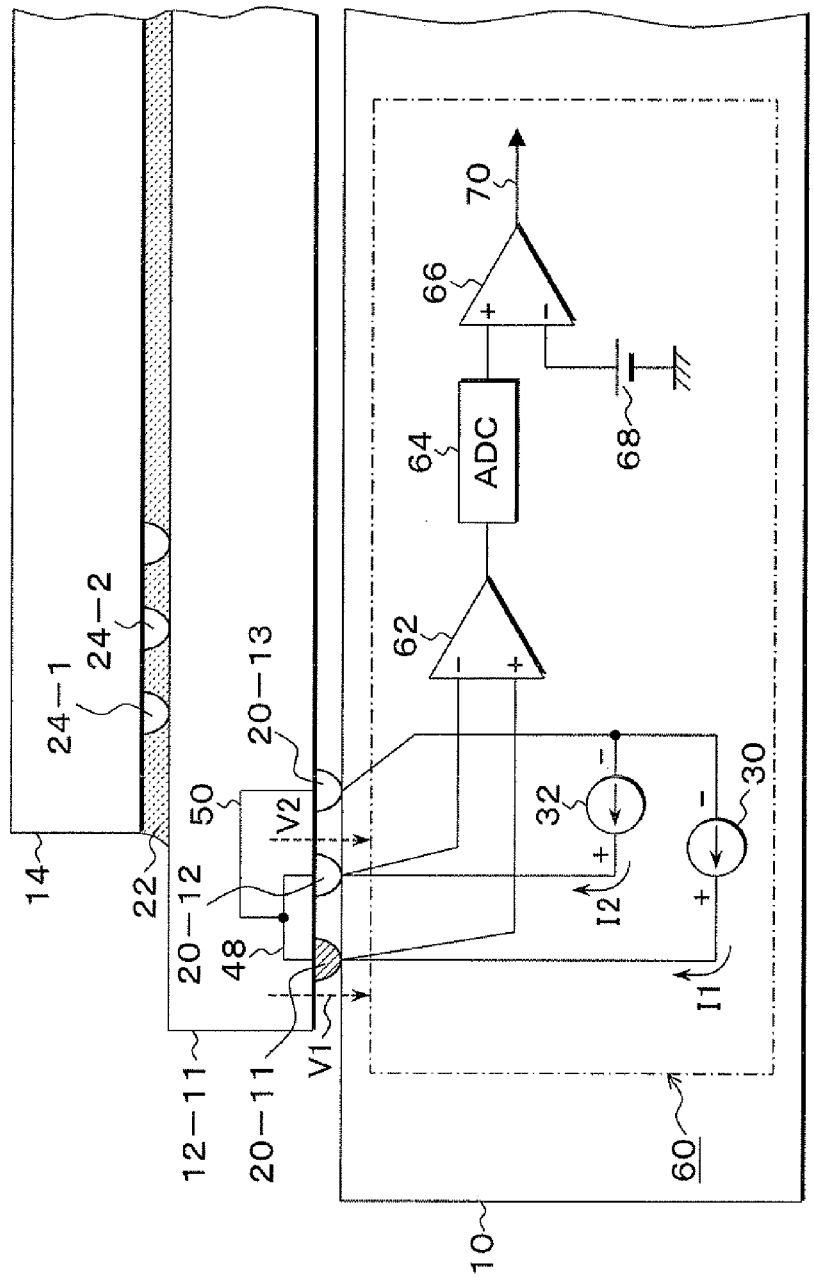
FIG. 15 is an explanatory drawing showing another embodiment in which a solder bump resistance measuring unit is provided on a mother board on which a ceramic-made BGA package is mounted.

FIG. 15 is an explanatory diagram showing another embodiment in which the solder bump resistance measuring unit is provided in a mother board on which a ceramic-made BGA package is mounted. In FIG. 15, in the ceramic-made BGA package 12-11, the solder bump at an outermost peripheral corner part is considered to be the monitored bump 20-11, the solder bump inside of it is considered to be the reference bump 20-12, and the bump which is further inside of it is considered to be the relay bump 20-13. In this embodiment, the solder bump resistance measuring unit 60 is incorporated at the mother board 10 side. The configuration of the solder bump resistance measuring unit 60 is same as the case in FIG. 10 in which it is provided in the processor module 14 side. More specifically, the solder bump resistance measuring unit 60 is composed of the first constant current source 30, the second constant current source 32, the differential voltage detection unit 62, the AD converter 64, and the digital comparator 66 comprising the threshold voltage 68. The solder bump resistance measuring unit 60 is directly connected to the monitored bump 20-11, the reference bump 20-12, and the relay bump 20-13 of the synthetic-resin-made BGA package 12-12 by measurement terminals, connects the monitored bump 20-11 and the reference bump 20-12 to each other at the synthetic-resin-made BGA package 12-12 side by the measurement wiring pattern 48, and further connects them to the relay bump 20-13 by the measurement wiring pattern 50. As described above, the equivalent circuit of the solder bump resistance measuring unit 60 incorporated in the mother board 10 is also same as FIG. 12, the differential voltage (V1−V2) subtracting the voltage V2 generated by causing the constant current I2 to flow through the reference bump 20-12 from the voltage V1 generated by causing the constant current I1 to flow through the monitored bump 20-11 is obtained by the differential voltage detection unit 62, converted into differential voltage data in the AD converter 64, and compared with the threshold voltage 68 in the digital comparator 66. When it exceeds the threshold voltage 68, a malfunction detection signal 70 is output. The malfunction detection signal 70 from the digital comparator 66 may be notified to the processor module 14, which is mounted, for example, on the synthetic-resin-made BGA package 12-12, so that the processor module 14 itself detects the malfunction, stops the self operation of it, and performs processes of degeneration. Moreover, the malfunction detection signal 70 from the digital comparator 66 can be subjected to error notification to an outside device so as to take necessary measures. The differential voltage data output from the AD converter 64 can be transferred to an outside measurement display unit or the like so as to subject the measured resistance in the monitored bump 20-11 to monitor-display. Moreover, as the solder bump resistance measuring unit 60 incorporated in the mother board 10, a discrete circuit may be mounted on the mother board 10; alternatively, a dedicated IC module in which the solder bump resistance measuring unit 60 is incorporated may be mounted on the mother board 10.

Figure 16:
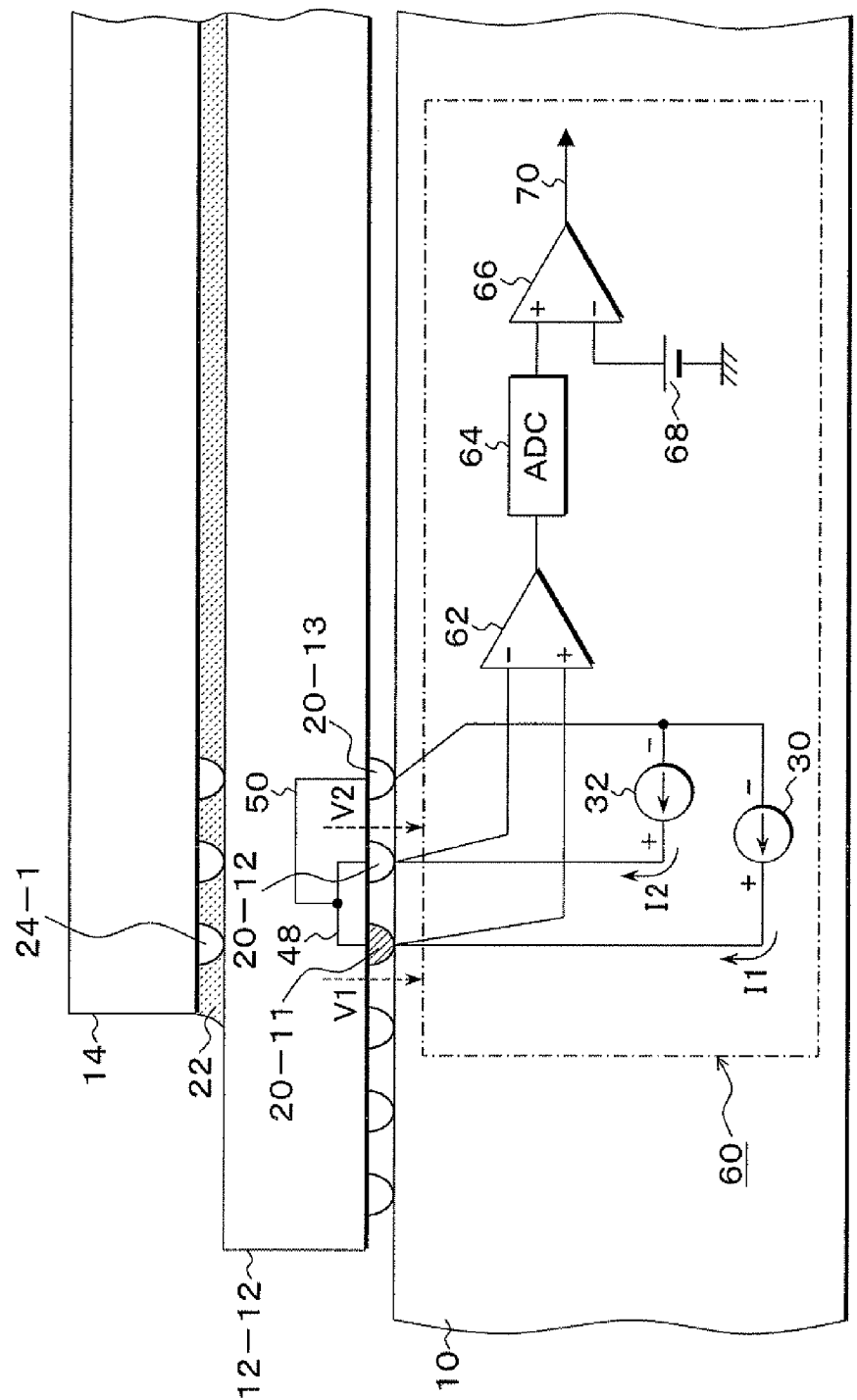
FIG. 16 is an explanatory drawing showing another embodiment in which a solder bump resistance measuring unit is provided on a mother board on which a synthetic resin-made BGA package is mounted.

FIG. 16 is an explanatory diagram showing another embodiment in which the solder bump resistance measuring unit is provided in the mother board on which a synthetic-resin-made BGA package is mounted. In FIG. 16, the monitored bump 20-11 in the synthetic-resin-made BGA package 12-12 is positioned immediately below the solder bump 24-1 at an outermost peripheral corner part of the processor module 14, the inside thereof is the reference bump 20-12, and the bump further inside thereof is the relay bump 20-13. The solder bump resistance measuring unit 60 incorporated in the mother board 10 is same as the embodiment in FIG. 15 and is composed of the first constant current source 30, the second constant current source 32, the differential voltage detection unit 62, the AD converter 64, and the digital comparator 66 having the threshold voltage 68. The measurement wiring patterns 48 and 50 at the synthetic-resin-made BGA package 12-12 side are also same as the embodiment in FIG. 15. Note that, in the above describe embodiments, the cases in which the solder bump resistance measuring unit is provided in the outside device, the processor module, or the mother board are taken as examples; however, other than these, a circuit same as the solder bump resistance measuring unit 60 may be incorporated in the BGA package itself. Moreover, in the above described embodiments, the case in which the processor module is mounted on the mother board by the BGA package is taken as an example; however, no limitation is imposed on by this, the embodiments can be applied, without modification, to the case in which an arbitrary LSI is mounted on a comparatively large circuit board, and limitation in terms of use is not imposed on thereto. The current values caused to flow from the first constant current source and the second constant current source to the monitored bump and the reference bump can be arbitrarily determined in accordance with the resistance resolution power necessary for the monitored bump, and no limitation is imposed on by the numerical values shown in the embodiments. Moreover, in the above described embodiments, the solder bump at the outermost peripheral corner part is selected as the monitored bump for the ceramic-made BGA package, and the solder bump immediately below the outermost peripheral corner part of the processor module is selected as the monitored bump for the synthetic-resin-made BGA package so as to measure the resistance change; however, the present embodiments are not limited thereto, and, as a matter of course, an arbitrary solder bump which is most readily damaged in the mounting structure using the BGA package may be used as the monitored bump so as to apply the solder bump resistance measurement according to the present embodiments. Moreover, the present art includes arbitrary modifications that do not impair the object and advantages thereof and is not limited by the numerical values shown in the above described embodiments.

What is claimed is:

1. A high-sensitive resistance measuring device of solder bumps comprising:
   a package having a rear surface on which plural solder bumps are arranged;
   a circuit board on which the solder bumps of the package are mounted by soldering;
   a monitored bump connection unit which is selected as a solder connection unit which is readily damaged by deforming stress;
   a reference bump connection unit which is selected as a solder connection unit which is not readily damaged by deforming stress;
   a first constant current source which is connected to the monitored bump connection unit in series and causes a constant current to flow, and a second constant current source which commonly connects the series circuit of the first constant current source and the monitored bump connection unit by common sides; and
   a resistance variation detection unit which detects a differential voltage ($\Delta V = V1 - V2$), which is obtained by subtracting a second voltage (V2) generated in the reference bump connection unit by the constant current (I) from the second constant current source from a first voltage (V1) generated in the monitored bump connection unit by the constant current I from the first constant current source, as a resistance variation voltage representing the resistance variation ($\Delta R$) of the monitored bump connection unit.

2. The high-sensitive resistance measuring device of the solder bumps according to claim 1, wherein the monitored bump connection unit is a solder bump connection unit positioned at an outermost periphery of the ball grid array package, and the reference bump connection unit is a solder bump connection unit positioned at an inner periphery of the monitored bump connection unit.

3. The high-sensitive resistance measuring device of the solder bumps according to claim 1, wherein, when the package is made of ceramic, and a semiconductor device having a rear surface on which plural solder bumps are arranged is mounted on the package by soldering,
   the monitored bump connection unit is a solder bump connection unit positioned at an outermost peripheral corner of the package, and the reference bump connection unit is a solder bump connection unit positioned at an inner peripheral corner adjacent to the outermost peripheral corner.

4. The high-sensitive resistance measuring device of the solder bumps according to claim 1, wherein, when the package is made of a synthetic resin, and a semiconductor device having a rear surface on which plural solder bumps are arranged is mounted on the package by soldering,
   the monitored bump connection unit is a solder bump connection unit of the package positioned immediately below the solder bump positioned at an outermost peripheral corner of the semiconductor device, and the reference bump connection unit is a solder bump connection unit which is positioned at an inner peripheral corner adjacent to the outermost peripheral corner.

5. The high-sensitive resistance measuring device of the solder bumps according to claim 1, wherein the first constant current source, the second constant current source, and the resistance variation detection unit are provided in an outside measurement unit.

6. The high-sensitive resistance measuring device of the solder bumps according to claim 5, wherein the resistance variation detection unit is a DC voltmeter, connects the positive electric potential side of the monitored bump connection unit to a positive terminal of the DC voltmeter, connects the positive electric potential side of the reference bump connection unit to a negative terminal of the DC voltmeter, and displays the resistance variation voltage in the voltmeter.

7. The high-sensitive resistance measuring device of the solder bumps according to claim 1, wherein, when a semiconductor device having a rear surface on which plural solder bumps are arranged is mounted on the package by soldering,
   the first constant current source, the second constant current source, and the resistance variation detection unit are provided in the semiconductor device.

8. The high-sensitive resistance measuring device of the solder bumps according to claim 1, wherein the resistance variation detection unit provided in the semiconductor device includes a differential voltage detection unit which detects a differential voltage obtained by subtracting the second voltage generated in the reference bump connection unit from the first voltage generated in the monitored bump connection unit; and
   a malfunction determination unit which outputs a malfunction detection signal when the differential voltage exceeds a threshold voltage in accordance with predetermined resistance variation set in advance.

9. The high-sensitive resistance measuring device of the solder bumps according to claim 8, wherein the semiconductor device is a processor and, when the malfunction detection signal is output from the resistance variation detection unit, gives a notification of an error to outside and stops a process of itself.

10. The high-sensitive resistance measuring device of the solder bumps according to claim 1, wherein the first constant current source, the second constant current source, and the resistance variation detection unit are provided on the circuit board.

11. The high-sensitive resistance measuring device of the solder bumps according to claim 10, wherein the resistance variation detection unit provided in the circuit board includes
   a differential voltage detection unit which detects the differential voltage which is obtained by subtracting the second voltage generated in the reference bump connection unit from the first voltage generated in the monitored bump connection unit; and a malfunction determination unit which outputs a malfunction detection signal when the differential voltage exceeds a threshold voltage in accordance with predetermined resistance variation set in advance.

12. A high-sensitive resistance measuring method of solder bumps comprising:
- a selecting step of selecting, as a monitored bump connection unit, a solder connection unit which is readily damaged by deforming stress from among plural solder bumps of a package mounted on a circuit board and selecting, as a reference bump connection unit, a solder connection unit which is not readily damaged by deforming stress;
- a monitor current feeding step of causing a constant current to flow from a first constant current source connected in series to the monitored bump connection unit and causing the same constant current as the first constant current source to flow from a second constant current source which is connected to the reference bump connection unit in series and is commonly connected to the series circuit of the first constant current source and the monitored bump connection unit by common sides; and
- a resistance variation detection step of detecting a differential voltage ($\Delta V = V1 - V2$), which is obtained by subtracting a second voltage (V2) generated by the constant current (I) from the second constant current source in the reference bump connection unit from a first voltage (V1) generated by the constant current I from the first constant current source in the monitored bump connection unit, as a resistance variation voltage representing resistance variation ($\Delta R$) of the monitored bump connection unit.

13. The high-sensitive resistance measuring method of the solder bumps according to claim 12, wherein the monitored bump connection unit is a solder bump connection unit positioned at an outermost periphery of the package, and the reference bump connection unit is a solder bump connection unit positioned at an inner periphery of the monitored bump connection unit.

14. The high-sensitive resistance measuring method of the solder bumps according to claim 12, wherein, when the package is made of ceramic, and a semiconductor device having a rear surface on which plural solder bumps are arranged is mounted on the package by soldering,
the monitored bump connection unit is a solder bump connection unit positioned at an outermost peripheral corner of the package, and the reference bump connection unit is a solder bump connection unit positioned at an inner peripheral corner adjacent to the outermost peripheral corner.

15. The high-sensitive resistance measuring method of the solder bumps according to claim 12, wherein, when the package is made of a synthetic resin, and a semiconductor device having a rear surface on which plural solder bumps are arranged is mounted on the package by soldering,
the monitored bump connection unit is a solder bump connection unit of the package positioned immediately below the solder bump positioned at an outermost peripheral corner of the semiconductor device, and the reference bump connection unit is a solder bump connection unit which is positioned at an inner peripheral corner adjacent to the outermost peripheral corner.

16. The high-sensitive resistance measuring method of the solder bumps according to claim 12, wherein the first constant current source, the second constant current source, and a processing unit are provided in an outside monitoring unit; and
the processing unit of the monitoring unit is caused to perform the selecting step, the monitored current feeding step, and the resistance variation detection step.

17. The high-sensitive resistance measuring method of the solder bumps according to claim 12, wherein, when a semiconductor device having a rear surface on which plural solder bumps are arranged is mounted on the package by soldering,
the first constant current source, the second constant current source, and a processing unit are provided in the semiconductor device; and the processing unit of the semiconductor device is cause to perform the selecting step, the monitored current feeding step, and the resistance variation detection step.

18. The high-sensitive resistance measuring method of the solder bumps according to claim 12, wherein the resistance variation detection step performed by the processing unit of the semiconductor device includes
- a differential voltage detection step of detecting a differential voltage obtained by subtracting the second voltage generated in the reference bump connection unit from the first voltage generated in the monitored bump connection unit; and
- a malfunction determination step of outputting a malfunction detection signal when the differential voltage exceeds a threshold voltage in accordance with predetermined resistance variation set in advance; and
- furthermore, the semiconductor device is a processor, and, when the malfunction detection signal is output in the resistance variation detection step, gives a notification of an error to outside, and stops the process of itself.

19. The high-sensitive resistance measuring method of the solder bumps according to claim 12, wherein the first constant current source, the second constant current source, and a processing unit are provided on the circuit board, and the processing unit of the circuit board is caused to perform the processes of the selecting step, the monitored current feeding step, and the resistance variation detection step.

20. A high-sensitive resistance measuring device of solder bumps comprising:
- a package having a rear surface on which plural solder bumps are arranged;
- a circuit board on which the solder bumps of the package are mounted by soldering;
- a monitored bump connection unit which is selected as a solder connection unit which is readily damaged by deforming stress;
- a reference bump connection unit which is selected as a solder connection unit which is not readily damaged by deforming stress;
- a first constant current source which is connected to the monitored bump connection unit in series and causes a constant current to flow;
- a second constant current source which is connected to the reference bump connection unit in series and causes a constant current same as the first constant current source to flow;
- a bridge circuit formed by commonly connecting common sides of the series circuit of the first constant current source and the monitored bump connection unit and the series circuit of the second constant current source and the reference bump connection unit; and
- a resistance variation detection unit which detects the unbalanced voltage between the connecting point of the first constant current source and the monitored bump connection unit in the bridge circuit and the connecting point of the second constant current source and the reference bump connection unit as a resistance variation voltage representing resistance variation (ΔR) of the monitored bump connection unit.

21. The high-sensitive resistance measuring device of the solder bumps according to claim 20, wherein
the unbalanced voltage detected by the resistance variation detection unit is a differential voltage (ΔV=V1−V2), which is obtained by subtracting a second voltage (V2) generated in the reference bump connection unit by the constant current (I) from the second constant current source from a first voltage (V1) generated in the monitored bump connection unit by the constant current I from the first constant current source.

22. A high-sensitive resistance measuring device comprising:
a monitored site readily influenced by resistance variation by deforming stress when resistance is varied by the temperature;
a reference part which is not readily influenced by resistance variation by deforming stress when resistance is varied by the temperature as well as the monitored site;
a first constant current source which is connected to the monitored site in series and causes a constant current to flow;
a second constant current source which is connected to the reference part in series, causes a constant current same as the first constant current source to flow, and commonly connects the series circuit of the first constant current source and the monitored site by common sides; and
a resistance variation detection unit which detects a differential voltage (ΔV=V1−V2), which is obtained by subtracting a second voltage (V2) generated in the reference part by the constant current (I) from the second constant current source from a first voltage (V1) generated in the monitored site by the constant current (I) from the first constant current source, as a resistance variation voltage representing the resistance variation (ΔR) of the monitored site.

23. A high-sensitive resistance measuring method comprising:
a selecting step of selecting a monitored site in which resistance is varied according to the temperature and which is readily influenced by resistance variation by deforming stress, and selecting a reference part in which resistance is varied according to the temperature as well as the monitored site and which is not readily influenced by resistance variation by deforming stress;
a monitor current feeding step of causing a constant current to flow from a first constant current source connected in series to the monitored site and causing the same constant current as the first constant current source to flow from a second constant current source which is connected to the reference part in series and is commonly connected to the series circuit of the first constant current source and the monitored bump part by common sides; and
a resistance variation detection step of detecting a differential voltage (ΔV=V1−V2), which is obtained by subtracting a second voltage (V2) generated by the constant current (I) from the second constant current source in the reference part from a first voltage (V1) generated by the constant current (I) from the first constant current source in the monitored site, as a resistance variation voltage representing resistance variation (ΔR) of the monitored site.

* * * * *

UNITED STATES PATENT AND TRADEMARK OFFICE
CERTIFICATE OF CORRECTION

PATENT NO.       : 7,880,485 B2
APPLICATION NO.  : 12/116399
DATED            : February 1, 2011
INVENTOR(S)      : Naoaki Nakamura It is certified that error appears in the above-identified patent and that said Letters Patent is hereby corrected as shown below:

Title Page Column 2 Line 2, item [57] Abstract, Delete "comprises" and insert -- includes --, therefor.

Signed and Sealed this
Sixteenth Day of August, 2011

David J. Kappos
*Director of the United States Patent and Trademark Office*